US010123463B2

(12) United States Patent
Best et al.

(10) Patent No.: US 10,123,463 B2
(45) Date of Patent: Nov. 6, 2018

(54) LIQUID SUBMERGED, HORIZONTAL COMPUTER SERVER RACK AND SYSTEMS AND METHOD OF COOLING SUCH A SERVER RACK

(75) Inventors: Christiaan Scott Best, Austin, TX (US); Mark Garnett, Oklahoma City, OK (US)

(73) Assignee: Green Revolution Cooling, Inc., Austin, TX (US)

( * ) Notice: Subject to any disclaimer, the term of this patent is extended or adjusted under 35 U.S.C. 154(b) by 971 days.

(21) Appl. No.: 13/057,881

(22) PCT Filed: Aug. 10, 2009

(86) PCT No.: PCT/US2009/053305
§ 371 (c)(1),
(2), (4) Date: Feb. 7, 2011

(87) PCT Pub. No.: WO2010/019517
PCT Pub. Date: Feb. 18, 2010

(65) Prior Publication Data
US 2011/0132579 A1    Jun. 9, 2011

Related U.S. Application Data

(60) Provisional application No. 61/188,589, filed on Aug. 11, 2008, provisional application No. 61/163,443, (Continued)

(51) Int. Cl.
*F28D 15/00* (2006.01)
*H05K 7/20* (2006.01)
*G06F 1/20* (2006.01)

(52) U.S. Cl.
CPC ......... *H05K 7/20772* (2013.01); *F28D 15/00* (2013.01); *G06F 1/20* (2013.01);
(Continued)

(58) Field of Classification Search
CPC .......... H05K 7/20872; H05K 7/20627; H05K 7/20636; H05K 7/20645; H05K 7/20654;
(Continued)

(56) References Cited

U.S. PATENT DOCUMENTS 4,590,538 A * 5/1986 Cray, Jr. ........................ 361/700
4,834,257 A * 5/1989 Book et al. .................... 220/646
(Continued)

FOREIGN PATENT DOCUMENTS

CN       101443724       5/2009
JP       2004319628      11/2004
(Continued)

OTHER PUBLICATIONS

Inetl Core 2 Duo Processor on 65 nm process for Embedded Applications, Aug. 2007, Intel, pp. 1, 14, and 21.*
(Continued)

*Primary Examiner* — Christopher R Zerphey
(74) *Attorney, Agent, or Firm* — The Marbury Law Group, PLLC

(57) ABSTRACT

Apparatus, systems, and methods for efficiently cooling computing devices having heat-generating electronic components, such as, for example, independently operable servers, immersed in a dielectric liquid coolant in a tank.

33 Claims, 14 Drawing Sheets

Related U.S. Application Data filed on Mar. 25, 2009, provisional application No. 61/165,470, filed on Mar. 31, 2009.

(52) U.S. Cl.
CPC .............. *G06F 1/206* (2013.01); *H05K 7/20* (2013.01); *H05K 7/203* (2013.01); *H05K 7/2079* (2013.01); *H05K 7/20236* (2013.01); *H05K 7/20281* (2013.01); *H05K 7/20327* (2013.01); *H05K 7/20381* (2013.01); *H05K 7/20763* (2013.01); *H05K 7/20781* (2013.01); *H05K 7/20827* (2013.01); *H05K 7/20836* (2013.01); *G06F 2200/201* (2013.01); *H01L 2924/0002* (2013.01); *Y10T 29/4973* (2015.01)

(58) Field of Classification Search
CPC ........... H05K 7/20236; H05K 7/20709; H05K 7/20218; H05K 7/20763; H05K 7/203; H05K 7/20781; H05K 7/2079; G06F 1/20; G06F 2200/201; H01L 23/473; F24F 1/02; F25D 17/02
USPC .............. 62/259.2, 263, 434, 435; 361/699; 165/104.33

See application file for complete search history.

(56) References Cited

U.S. PATENT DOCUMENTS

| | | | |
|---|---|---|---|
| 5,297,621 A | 3/1994 | Taraci | |
| 6,374,627 B1* | 4/2002 | Schumacher et al. | 62/259.2 |
| 6,600,656 B1* | 7/2003 | Mori et al. | 361/724 |
| 6,621,707 B2 | 9/2003 | Ishimine | |
| 6,909,606 B2 | 6/2005 | Barsum | |
| 7,086,247 B2 | 8/2006 | Campbell | |
| 7,184,269 B2* | 2/2007 | Campbell et al. | 361/700 |
| 7,210,304 B2 | 5/2007 | Nagashima | |
| 7,307,841 B2 | 12/2007 | Berlin | |
| 7,318,322 B2* | 1/2008 | Ota et al. | 62/259.2 |
| 7,403,392 B2 | 7/2008 | Attlesey | |
| 7,609,518 B2 | 10/2009 | Hopton | |
| 7,905,106 B2 | 3/2011 | Attlesey | |
| 7,911,782 B2 | 3/2011 | Attlesey | |
| 7,911,793 B2 | 3/2011 | Attlesey | |
| 8,009,419 B2 | 8/2011 | Attlesey | |
| 2002/0185262 A1 | 12/2002 | Baer | |
| 2003/0053293 A1* | 3/2003 | Beitelmal et al. | 361/687 |
| 2003/0127240 A1 | 7/2003 | Beckbissinger | |
| 2004/0008490 A1* | 1/2004 | Cheon | 361/699 |
| 2004/0246683 A1* | 12/2004 | Honsberg-Riedl et al. | 361/720 |
| 2005/0083657 A1 | 4/2005 | Hamman | |
| 2005/0114876 A1 | 5/2005 | Atarashi | |
| 2005/0259402 A1* | 11/2005 | Yasui et al. | 361/716 |
| 2006/0026610 A1 | 2/2006 | Sasao | |
| 2006/0064709 A1 | 3/2006 | Throckmorto | |
| 2006/0123436 A1 | 6/2006 | Tanaka | |
| 2006/0135042 A1 | 6/2006 | Frost et al. | |
| 2006/0250755 A1 | 11/2006 | Tilton | |
| 2006/0274501 A1* | 12/2006 | Miller | 361/690 |
| 2007/0006599 A1* | 1/2007 | Kawamura et al. | 62/54.1 |
| 2007/0025081 A1* | 2/2007 | Berlin et al. | 361/698 |
| 2007/0034360 A1* | 2/2007 | Hall | 165/104.33 |
| 2007/0199340 A1* | 8/2007 | Knight et al. | 62/259.2 |
| 2007/0213000 A1 | 9/2007 | Day | |
| 2007/0267741 A1* | 11/2007 | Attlesey et al. | 257/714 |
| 2008/0002364 A1 | 1/2008 | Campbell et al. | |
| 2008/0017355 A1* | 1/2008 | Attlesey et al. | 165/104.33 |
| 2008/0026509 A1 | 1/2008 | Campbell | |
| 2008/0029250 A1* | 2/2008 | Carlson | F24F 11/0001 165/104.33 |
| 2008/0030945 A1* | 2/2008 | Mojaver et al. | 361/685 |
| 2008/0055845 A1 | 3/2008 | Murakami | |
| 2008/0158818 A1 | 7/2008 | Clidaras | |
| 2008/0196870 A1 | 8/2008 | Attlesey | |
| 2009/0260777 A1 | 10/2009 | Attlesey | |
| 2010/0226094 A1* | 9/2010 | Attlesey et al. | 361/699 |
| 2010/0246118 A1 | 9/2010 | Attlesey | |
| 2010/0290190 A1 | 11/2010 | Chester et al. | |
| 2010/0302678 A1 | 12/2010 | Merrow | |
| 2011/0075353 A1 | 3/2011 | Attlesey | |
| 2011/0132579 A1 | 6/2011 | Best et al. | |
| 2011/0240281 A1 | 10/2011 | Avery | |

FOREIGN PATENT DOCUMENTS

| | | |
|---|---|---|
| JP | 2004363308 | 12/2004 |
| WO | WO 2007023130 | 3/2007 |
| WO | WO 2007098078 | 8/2007 |
| WO | WO 2008027931 | 3/2008 |
| WO | WO 2008089322 | 7/2008 |
| WO | 2010019517 | 2/2010 |

OTHER PUBLICATIONS

International Search Report and Written Opinion dated Oct. 14, 2009, Application No. PCT/US2009/053305, 10 pages.
Singapore Written Opinion and Search Report dated May 2, 2012, Application No. 201100595-6, 21 pages.
Examination Report from Australian Application No. 2009282170, dated Nov. 15, 2013, pp. 1-3.
Patent Examination Report No. 2 from Australian Application No. 2009282170, dated Jun. 18, 2014, pp. 1-4.
International Search Report and Written Opinion from PCT/US12/49668, dated Oct. 19, 2012, Green Revolution Cooling Inc., pp. 1-10.
Office Action from Chinese Application No. 200980131707.3, dated Dec. 31, 2014, English and Chinese versions, pp. 1-10.
Office Action from Chinese Application No. 200980131707.3, dated Apr. 3, 2014, English translation, pp. 1-13.
Office Action from Chinese Application No. 200980131707.3, dated Dec. 20, 2012, English and Chinese versions, pp. 1-17.
Office Action from Chinese Application No. 200980131707.3, dated Jul. 31, 2013, English and Chinese versions, pp. 1-8.
Office Action from Chinese Application No. 200980131707.3, dated Apr. 18, 2014, English and Chinese versions, pp. 1-7.
Office Action from Chinese Application No. 200980131707.3, dated Jul. 31, 2013, English translation, pp. 1-3.
U.S. Appl. No. 14/338,035, filed Jul. 22, 2014, Christiaan Scott Best.
U.S. Appl. No. 14/338,013, filed Jul. 22, 2014, Christiaan Scott Best.
U.S. Appl. No. 14/338,020, filed Jul. 22, 2014, Christiaan Scott Best.
U.S. Appl. No. 14/338,026, filed Jul. 22, 2014, Christiaan Scott Best.
U.S. Appl. No. 14/667,091, filed Mar. 24, 2015, Christiaan Scott Best.
Canadian Office Action dated Nov. 8, 2016 for Canadian Patent Application No. 2,731,994 related to National Phase of Application No. PCT/US2009/053305 filed Aug. 10, 2009.
Non-Final Office Action in U.S. Appl. No. 14/667,091, dated May 22, 2015, 16 pages.
Substantive Examination Adverse Report, Malaysian Application No. PI2011000494, dated May 15, 2015, 3 pages.

* cited by examiner

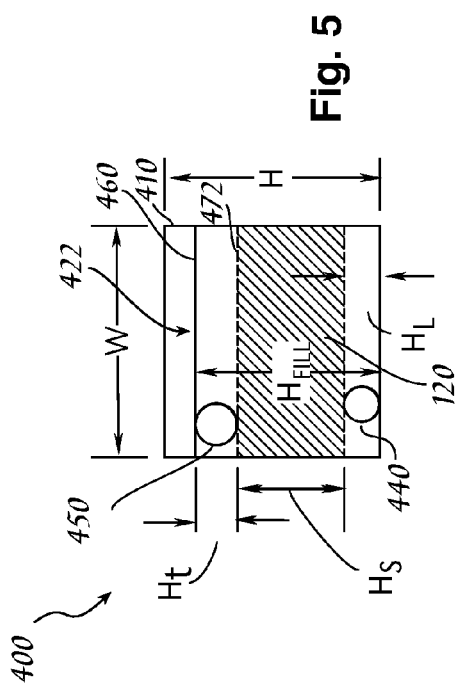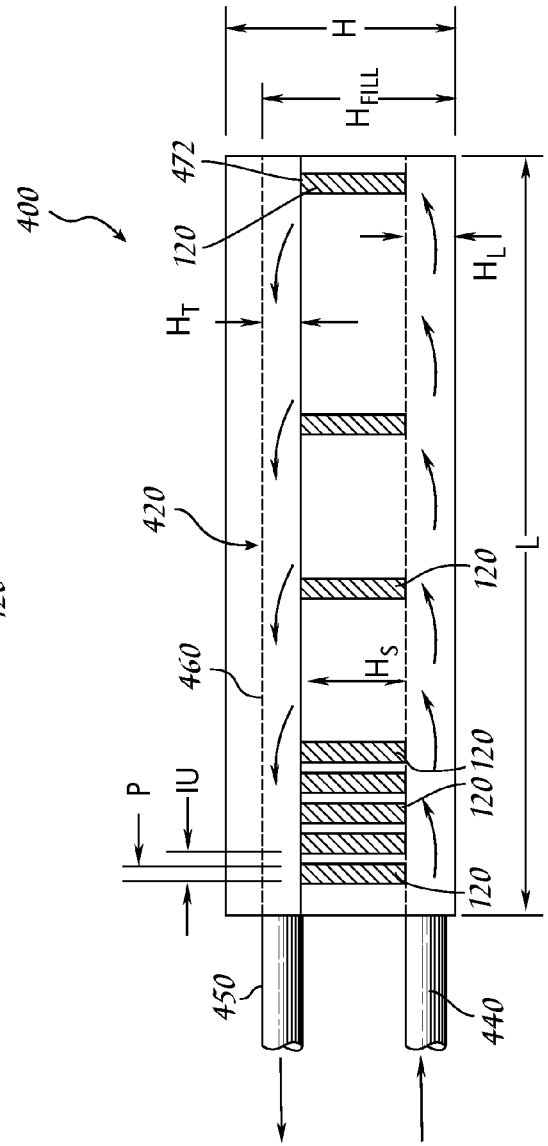

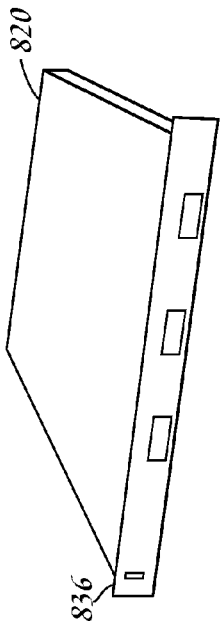
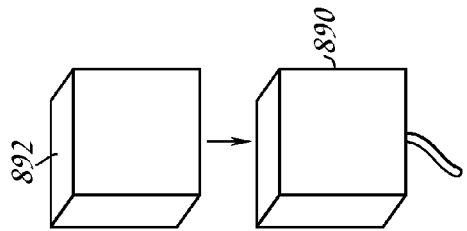
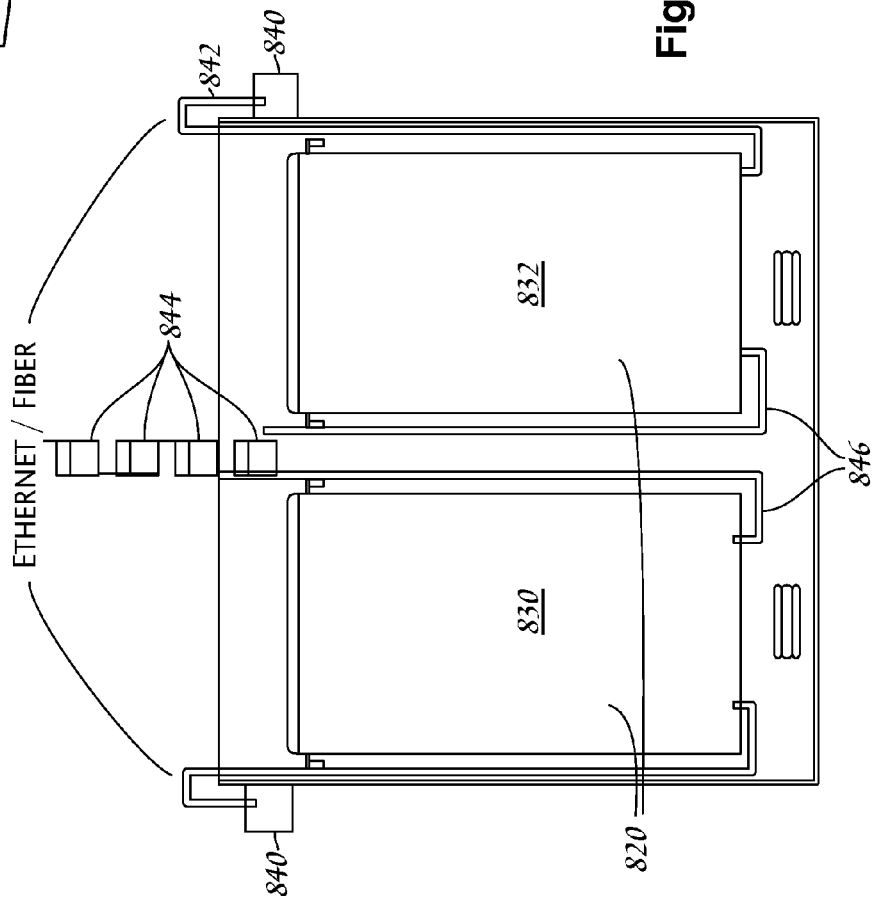

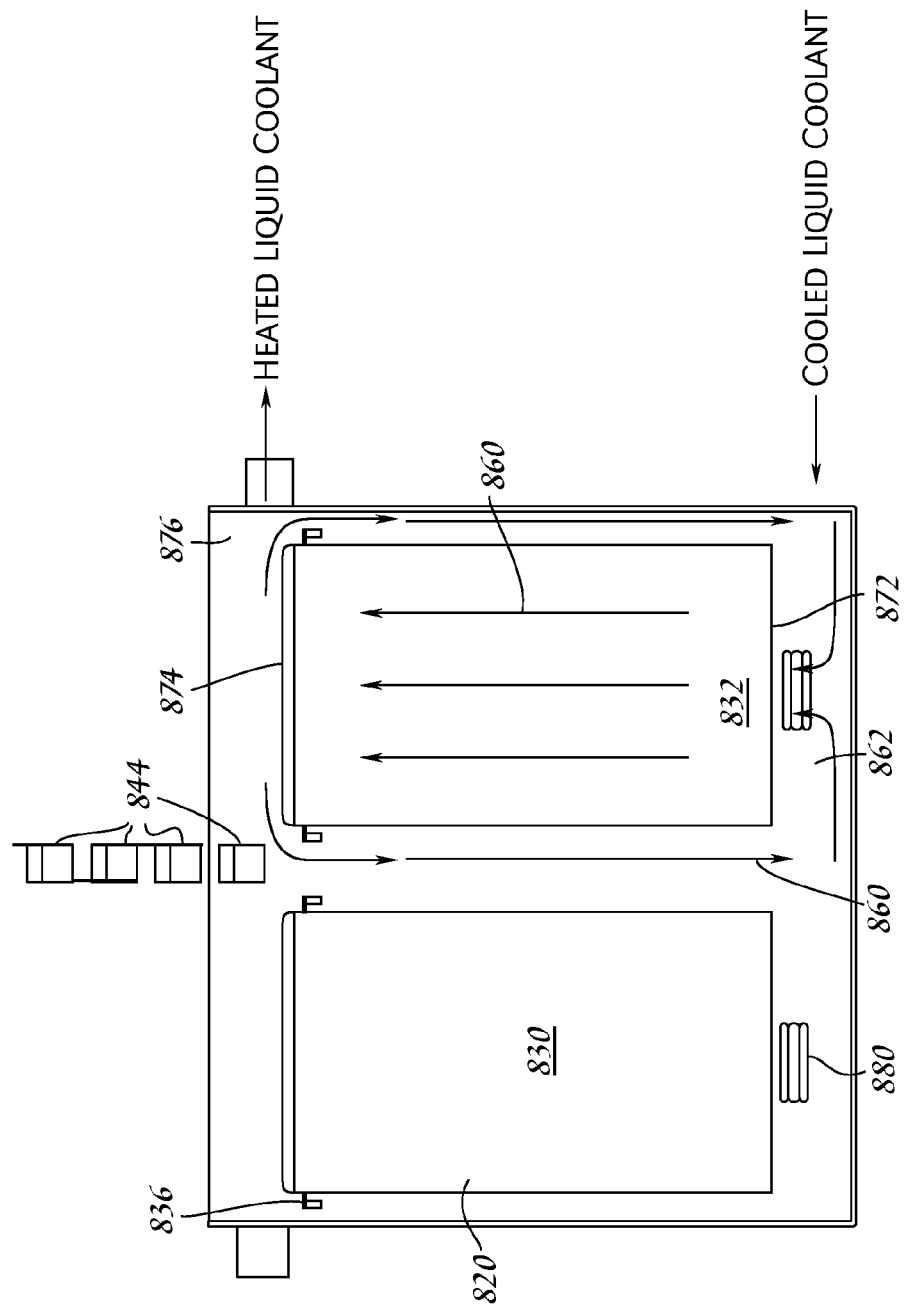

LIQUID SUBMERGED, HORIZONTAL COMPUTER SERVER RACK AND SYSTEMS AND METHOD OF COOLING SUCH A SERVER RACK

CROSS-REFERENCES TO RELATED APPLICATIONS

This application claims priority pursuant to 35 U.S.C. 119 to the following U.S. provisional patent applications:

Ser. No. 61/188,589 entitled LIQUID SUBMERGED, HORIZONTAL COMPUTER SERVER RACK filed Aug. 11, 2008;

Ser. No. 61/163,443 entitled LIQUID SUBMERGED, HORIZONTAL COMPUTER SERVER RACK filed Mar. 25, 2009; and Ser. No. 61/165,470 entitled LIQUID SUBMERGED, HORIZONTAL COMPUTER SERVER RACK filed Mar. 31, 2009.

FIELD OF INVENTION

This application concerns cooling of heat-generating electronics such as, for example, rack mounted servers in data centers.

BACKGROUND

In 2006, data centers in the United States (U.S.) accounted for about 1.5% (about $4.5 billion) of the total electricity consumed in the U.S. This data center electricity consumption is expected to double by 2011. More than one-third of data center electricity consumption is for cooling servers, which could equate to more than about 1% of all U.S. electricity consumed by 2011. Electricity, personnel, and construction costs continue to increase and server hardware costs are decreasing, making the overall cost of cooling a large and growing part of the total cost of operating a data center.

The term "data center" (also sometime referred to as a "server farm") loosely refers to a physical location housing one or "servers." In some instances, a data center can simply comprise an unobtrusive corner in a small office. In other instances, a data center can comprise several large, warehouse-sized buildings enclosing tens of thousands of square feet and housing thousands of servers. The term "server" generally refers to a computing device connected to a computing network and running software configured to receive requests (e.g., a request to access or to store a file, a request to provide computing resources, a request to connect to another client) from client computing devices, includes PDAs and cellular phones, also connected to the computing network. Such servers may also include specialized computing devices called network routers, data acquisition equipment, movable disc drive arrays, and other devices commonly associated with data centers.

Typical commercially-available servers have been designed for air cooling. Such servers usually comprise one or more printed circuit boards having a plurality of electrically coupled devices mounted thereto. These printed circuit boards are commonly housed in an enclosure having vents that allow external air to flow into the enclosure, as well as out of the enclosure after being routed through the enclosure for cooling purposes. In many instances, one or more fans are located within the enclosure to facilitate this airflow.

"Racks" have been used to organize several servers. For example, several servers can be mounted within a rack, and the rack can be placed within a data center. Any of various computing devices, such as, for example, network routers, hard-drive arrays, data acquisition equipment and power supplies, are commonly mounted within a rack.

Data centers housing such servers and racks of servers typically distribute air among the servers using a centralized fan (or blower). As more fully described below, air within the data center usually passes through a heat exchanger for cooling the air (e.g., an evaporator of a vapor-compression cycle refrigeration cooling system (or "vapor-cycle" refrigeration), or a chilled water coil) before entering a server. In some data centers, the heat exchanger has been mounted to the rack to provide "rack-level" cooling of air before the air enters a server. In other data centers, the air is cooled before entering the data center.

In general, electronic components of higher performing servers dissipate correspondingly more power. However, power dissipation for each of the various hardware components (e.g., chips, hard drives, cards) within a server can be constrained by the power being dissipated by adjacent heating generating components, the airflow speed and airflow path through the server and the packaging of each respective component, as well as a maximum allowable operating temperature of the respective component and a temperature of the cooling air entering the server as from a data center housing the server. The temperature of an air stream entering the server from the data center, in turn, can be influenced by the power dissipation and proximity of adjacent servers, the airflow speed and the airflow path through a region surrounding the server, as well as the temperature of the air entering the data center (or, conversely, the rate at which heat is being extracted from the air within the data center).

In general, a lower air temperature in a data center allows each server component to dissipate a higher power, and thus allows each server to dissipate more power and operate at a level of hardware performance. Consequently, data centers have traditionally used sophisticated air conditioning systems (e.g., chillers, vapor-cycle refrigeration) to cool the air (e.g., to about 65° F.) within the data center for achieving a desired performance level. By some estimates, as much as one watt can be consumed to remove one watt of heat dissipated by an electronic component. Consequently, as energy costs and power dissipation continue to increase, the total cost of cooling a data center has also increased.

In general, spacing heat-dissipating components from each other (e.g., reducing heat density) makes cooling such components less difficult (and less costly when considering, for example, the cost of cooling an individual component in a given environment) than placing the same components placed in close relation to each other (e.g., increasing heat density). Consequently, data centers have also compensated for increased power dissipation (corresponding to increased server performance) by increasing the spacing between adjacent servers.

In addition, large-scale data centers have provided several cooling stages for cooling heat dissipating components. For example, a stream of coolant, e.g., water, can pass over an evaporator of a vapor-compression refrigeration cycle cooling system and be cooled to, for example, about 44° F. before being distributed through a data center for cooling air within the data center.

The power consumed by a chiller can be estimated using information from standards (e.g., ARI 550/590-98). For example, ARI550/590-98 specifies that a new centrifugal compressor, an efficient and common compressor used in high-capacity chillers, has a seasonal average Coefficientof-Performance ("COP") from 5.00 to 6.10, depending on the cooling capacity of the chiller. This COP does not include power consumed by an evaporative cooling tower, which can be used for cooling a condenser in the refrigeration cycle cooling system and generally has a COP of 70, or better. The combined COP for a typical system is estimated to be about 4.7.

According to some estimates, some state-of-the-art data centers are capable of cooling only about 150 Watts-per-square-foot, as opposed to cooling the more than about 1,200 Watts-per-square-foot that could result from arranging servers to more fully utilize available volume (e.g., closely spacing servers and racks to more fully utilize floor-to-ceiling height and floor space) within existing data centers. Such a low cooling capacity can significantly add to the cost of building a data center, since data centers can cost as much as about $250 per-square-foot to construct.

As the air-cooling example implies, commercially available methods of cooling have not kept pace with increasing server and data-center performance needs, or the corresponding growth in heat density. As a consequence, adding new servers to existing data centers has become difficult and complex given the effort expended to facilitate additional power dissipation, such as by increasing an existing data center's air conditioning capacity.

Various alternative approaches for cooling data centers and their servers, e.g., using liquid cooling systems, have met with limited success. For example, attempts to displace heat from a microprocessor (or other heat-generating semiconductor-fabricated electronic device component, collectively referred to herein as a "chip") for remotely cooling the chip have been expensive and cumbersome. In these systems, a heat exchanger or other cooling device, has been placed in physical contact (or close physical relation using a thermal-interface material) with the package containing the chip. These liquid-cooled heat exchangers have typically defined internal flow channels for circulating a liquid internally of a heat exchanger body. However, component locations within servers can vary from server to server. Accordingly, these liquid-cooling systems have been designed for particular component layouts and have been unable to achieve large-enough economies of scale to become commercially viable.

Research indicates that with state-of-the-art cooling, PUEs (as defined on page 10 hereinafter) of 1.4 might be attainable by 2011. However the costs to capitalize such cooling were not mentioned, and indicators suggest that saving electricity requires expensive equipment.

Immersion cooling of electronic components has been attempted in high-performance (e.g., computer gaming) applications, but has not enjoyed widespread commercial success. Previous attempts at immersion cooling has submerged some, and in some instances all, components mounted to a printed circuit board in a dielectric fluid using a hermetically sealed enclosure to contain the fluid. Such systems have been expensive, and offered by a limited number of suppliers. Large scale data centers generally prefer to use "commoditized" servers and tend to not rely on technologies with a limited number of suppliers.

Control systems have been used to increase cooling rates for a plurality of computers in response to increased computational demand. Even so, such control systems have controlled cooling systems that dissipate heat into the data center building interior air (which in turns needs to be cooled by air conditioning), or directly use refrigeration as a primary mode of heat dissipation. Refrigeration as a primary mode of cooling, directly or indirectly, requires significant amounts of energy.

Two-phase cooling systems have been attempted, but due to technical complexity, they have not resulted in cost-effective products or sufficiently low operating costs to justify investing in two-phase-cooling capital. Still other single- and two-phase cooling systems bring the coolant medium to an exterior of the computer, but reject heat to a cooling medium (e.g., air) external to the computer and within the data center (e.g., within a server room). Accordingly, each method of server or computer cooling currently employed or previously attempted have been prohibitively expensive and/or insufficient to meet increasing cooling demands of computing devices.

Indirectly, many researchers have tried to reduce the power of individual components such as the power supply and CPU. Although chips capable of delivering desirable performance levels while operating at a lower relative power have been offered by chip manufacturers, such chips have, to date, been expensive. Consequently, cooling approaches to date have resulted in one or more of a high level of electricity consumption, a large capital investment and an increase in hardware expense.

Therefore, there exists the need for an effective, efficient and low-cost cooling alternative for cooling electronic components, such as, for example, rack-mounted servers.

SUMMARY OF INVENTION

Briefly, the present invention provides novel apparatus, systems, and methods for efficiently cooling computing devices having heat-generating electronic components, such as, for example, independently operable servers immersed in a dielectric liquid coolant in a tank.

The system may include at least one tank defining an interior volume and having a coolant inlet for receiving a dielectric liquid coolant within the interior volume and having a coolant outlet for allowing the dielectric liquid coolant to flow from the interior volume, the coolant inlet and the coolant outlet being fluidly coupled to each other; one or more mounting members positioned within the interior volume and configured to mountably receive a plurality of independently operable servers; a dielectric liquid coolant; a heat exchanger fluidly coupled to the coolant outlet of the at least one tank, the heat exchanger being distally located from the tank; a pump fluidly coupled to the heat exchanger and the interior volume of the at least one tank, the pump being configured for pumping the liquid coolant through a fluid circuit comprising a first circuit portion extending from the coolant inlet of the tank to each server, a second circuit portion extending from each respective server to the coolant outlet, a third circuit portion extending from the coolant outlet to the heat exchanger, and a fourth portion extending from the heat exchanger to the coolant inlet; a controller for monitoring the temperature of the dielectric liquid coolant at at least one location within the fluid circuit and for adjusting the flow of the dielectric liquid coolant through the fluid circuit in order that the dielectric liquid coolant is maintained at an elevated temperature as it exits the second circuit portion of the fluid circuit; wherein the at least one tank is configured for containing the dielectric liquid coolant within the interior volume such that, when the plurality of servers are mountably received therein, each server is submerged within the dielectric liquid coolant for sufficiently cooling each respective server while maintaining the exiting heated liquid coolant at the elevated temperature to reduce the amount of energy consumed to sufficiently cool each of the plurality of servers.

Alternatively, the cooling system includes at least one tank defining an open interior volume; one or more mounting members positioned within the open interior volume and configured to mountably receive a plurality of independently operable servers within the interior volume; a dielectric liquid coolant circulating in a first fluid circuit through the plurality of servers; a secondary cooling system having a cooling fluid flowing in a second fluid circuit wherein the secondary cooling system rejects heat from the cooling fluid; a coupler located within the at least one tank for thermally coupling heated dielectric coolant from the portion of the first fluid circuit exiting the plurality of servers within the tank to the cooling fluid in the second fluid circuit for rejecting heat from such heated dielectric coolant; a controller for monitoring the temperature of the dielectric liquid coolant at at least one location within the first fluid circuit and for adjusting the flow of the cooling fluid through the second fluid circuit in order that the heated dielectric liquid coolant exiting the plurality of servers is maintained approximately at an elevated temperature wherein the elevated temperature is a temperature significantly higher than the typical comfortable room temperature for humans and lower than the maximum permissible temperature of the most sensitive heat generating electronic component in the plurality of servers; wherein the at least one tank is configured for containing the dielectric liquid coolant within the interior volume such that, when the plurality of servers are mountably received therein, at least a substantial portion of each server is submerged within the dielectric liquid coolant for sufficiently cooling each respective server when the tank is sufficiently full of the liquid coolant maintaining the liquid coolant [exiting] the plurality of servers at approximately the elevated temperature to reduce the amount of energy consumed to sufficiently cool each respective server.

Alternatively, the cooling system may include at least one tank defining an open interior volume; one or more mounting members positioned within the open interior volume and configured to mountably receive a plurality of independently operable servers within the interior volume; a dielectric liquid coolant circulating in a first fluid circuit through the plurality of servers; a secondary cooling system having a cooling fluid flowing in a second fluid circuit wherein the secondary cooling system rejects some of the heat from the cooling fluid; a coupler located within the at least one tank for thermally coupling heated dielectric coolant from the portion of the first fluid circuit exiting the plurality of servers within the tank to the cooling fluid in the second fluid circuit for rejecting some of the heat from such heated dielectric coolant; a controller for monitoring the temperature of the dielectric liquid coolant at at least one location within the first fluid circuit and for adjusting the flow of the cooling fluid through the second fluid circuit in order that the heated dielectric liquid coolant exiting the plurality of servers is maintained approximately at an elevated temperature wherein the elevated temperature is a temperature significantly higher than the typical comfortable room temperature for humans and lower than the maximum permissible temperature of the most sensitive heat generating electronic component in the plurality of servers; wherein the at least one tank is configured for containing the dielectric liquid coolant within the interior volume such that, when the plurality of servers are mountably received therein, each server is submerged within the dielectric liquid coolant for sufficiently cooling each respective server and maintaining the liquid coolant exiting the plurality of servers at approximately the elevated temperature to reduce the amount of energy consumed to sufficiently cool each respective server.

The fixture or server rack apparatus includes at least one tank defining an open interior volume and having a coolant inlet for receiving a dielectric liquid coolant within the open interior volume and having a coolant outlet for allowing the coolant to flow from the open interior volume, the coolant inlet and the coolant outlet being fluidly coupled to each other; and one or more mounting members positioned within the interior volume and configured to mountably receive a plurality of servers in a vertical orientation within the interior volume for minimizing the footprint of the server relative to the ground and with the front of the server facing upward for easy installation and removal of each of the plurality of servers without removing or disturbing any other server; wherein the at least one tank is configured for containing a dielectric liquid coolant within the interior volume such that, when a plurality of servers are mountably received therein, each server being mountably received is submerged within the dielectric liquid coolant for sufficiently cooling each respective server when the tank is sufficiently full of the liquid coolant.

A server room fluidly connected to a first heat exchanger distally located from the server room contains the apparatus described above, including at least one tank defining an interior volume for containing a dielectric liquid coolant and one or more mounting members positioned within the interior volume and configured to mountably receive a plurality of independently operable servers. The server room also contains a plurality of independently operable servers wherein each of the plurality of servers is mountably received by the one or more mounting members such that each of the respective servers is submerged in a volume of dielectric liquid coolant for absorbing heat from each respective one of the plurality of servers. The server room further contains at least one coupler for thermally coupling the heated dielectric liquid coolant heated to the heat exchanger for rejecting at least some of the heat absorbed by the dielectric liquid coolant from each of the plurality of servers. The heat exchanger may be associated with a secondary cooling system. The coupler may include a fluid coupler for fluidly coupling the dielectric liquid coolant to the first heat exchanger. Alternatively, the coupler includes a heat exchanger located internal to the tank and thermally coupled to the dielectric liquid coolant heated by the servers and a secondary fluid circuit with a second cooling fluid in fluid connection between the distally located heat exchanger and the internally located heat exchanger wherein the dielectric liquid coolant differs from the cooling fluid wherein the distally located heat exchanger is thermally coupled to the cooling fluid flowing in the secondary fluid circuit such that the distally located heat exchanger rejects heat from the cooling fluid which the cooling fluid has absorbed from the heated dielectric liquid coolant at the coupler.

A method of cooling a plurality of independently operable servers includes flowing a dielectric liquid coolant in a fluid circuit through the plurality of servers immersed within the dielectric liquid coolant for absorbing at least a portion of any heat being dissipated by each of the respective servers; monitoring the temperature of the liquid coolant at at least one location within the fluid circuit; determining the optimum elevated temperature of the heated dielectric liquid coolant as it exits the plurality of servers such that the liquid coolant sufficiently cools the plurality of servers while reducing the amount of energy consumed to sufficiently cool each respective server, wherein the elevated temperature is a temperature significantly higher than the typical comfortable room temperature for humans and lower than the maximum permissible temperature of the most sensitive heat generating electronic component in the plurality of servers; periodically determining by a controller the amount of energy needed to reject the absorbed heat for cooling the plurality of servers; thermally coupling the dielectric liquid coolant heated by the plurality of servers to a heat exchanger distally located from the tank; and rejecting at least a portion of the heat absorbed by the liquid coolant. In response to the periodic determination of the amount of energy needed to reject the heat absorbed by the dielectric liquid coolant from the servers by a controller, the method may also include the step of periodically adjusting the amount of heat rejected through the heat exchanger such that the dielectric liquid coolant exiting the plurality of servers at the elevated temperature sufficiently cools the plurality of servers while reducing the amount of energy consumed to sufficiently cool each respective server.

BRIEF DESCRIPTION OF THE DRAWINGS

For a more complete understanding of the present invention(s), and the advantages thereof, reference is now made to the following descriptions taken in conjunction with the accompanying drawings, in which:

FIG. 5 illustrates an end elevation view of the immersion-cooled rack shown in FIG. 3.

FIG. 6 illustrates a side elevation view of the immersion-cooled rack shown in FIG. 3.

FIG. 12A is perspective view of one version of a conventional rack-mountable server that may be installed in the exemplary immersion-cooled server racks depicted in FIGS. 3 through 11;

FIG. 12B is an illustration of a hard drive of the conventional rack-mountable server of FIG. 12A with a liquid-proof enclosure to be inserted around it;

FIG. 13 is an end elevation view of the immersion-cooled server racks of FIG. 11;

FIG. 14 is another end elevation view of the immersion-cooled server racks of FIG. 11 showing the flow of the liquid coolant;

DETAILED DESCRIPTION

Figure 1A:
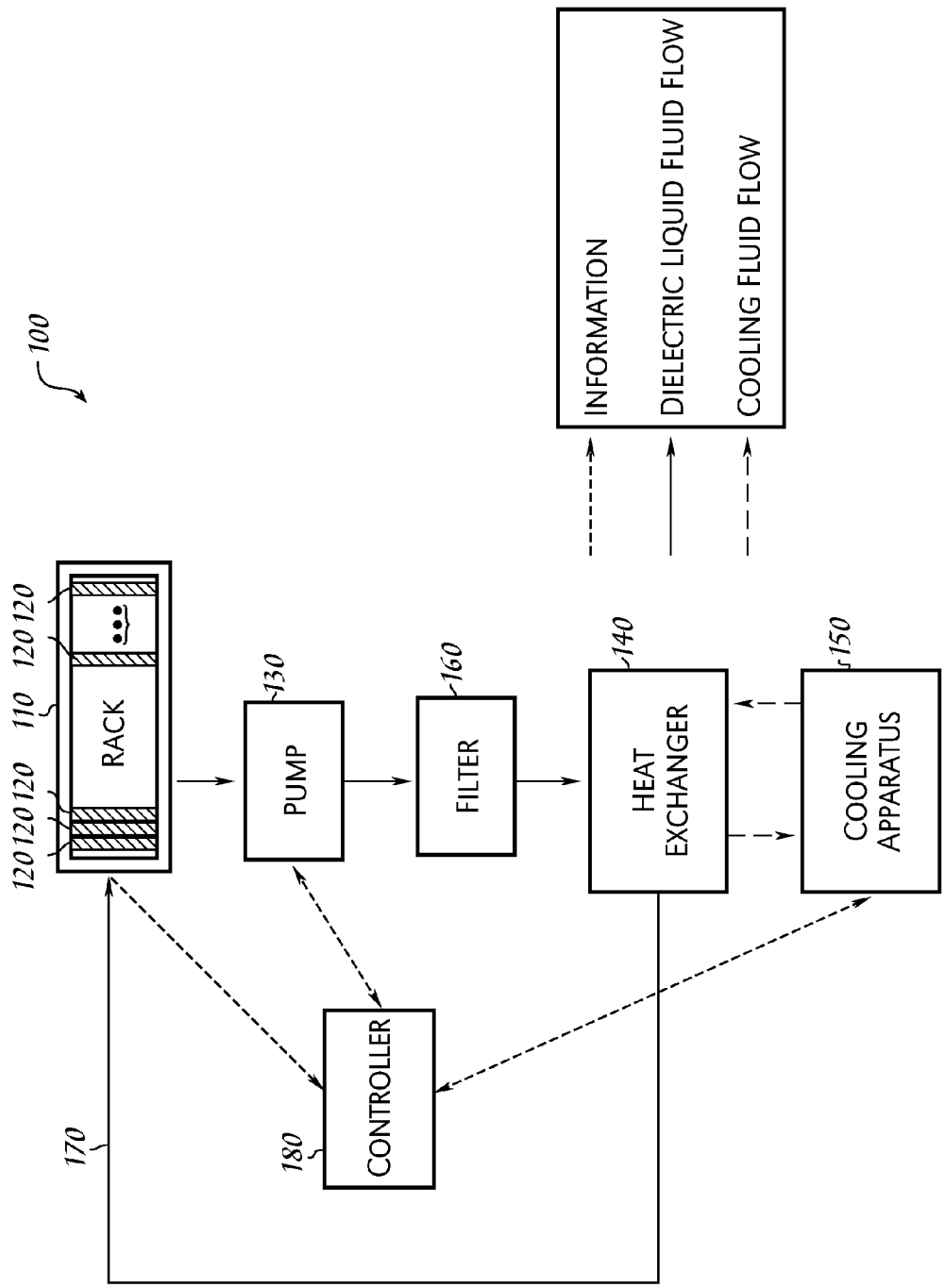
FIG. 1A illustrates one embodiment of an exemplary system for efficiently cooling a plurality of independently operable servers.

The following describes apparatus, systems, and methods for efficiently cooling computing devices having heat-generating electronic components, such as, for example, independently operable servers at least partially immersed in a dielectric liquid coolant in a tank. The principles of the invention(s) embodied therein and their advantages are best understood by referring to FIGS. 1-17.

As used herein, the term "server" generally refers to a computing device connected to a computing network and running software configured to receive requests (e.g., a request to access or to store a file, a request to provide computing resources, a request to connect to another client) from client computing devices, includes PDAs and cellular phones, also connected to the computing network. Such servers may also include specialized computing devices called blade servers, network routers, data acquisition equipment, movable disc drive arrays, and other devices commonly associated with data centers.

As used herein, "independently operable" means capable of usefully functioning without regard to an operational status of an adjacent component. As used herein, an "independently operable server" means a server that is capable of usefully functioning (e.g., powered or unpowered, connected to a network or disconnected from the network, installed in a rack or removed from a rack, and generally used for the purposes for which servers are generally used) without regard to an operational status of an adjacent server (e.g., powered or unpowered, connected to the network or disconnected from the network, installed in the rack or removed from the rack, and whether usable for the purposes for which servers are generally used). Operation of independently operable servers can be influenced (e.g., heated) by one or more adjacent servers, but as used herein, an independently operable server generally functions regardless of whether an adjacent server operates or is operable.

As used herein, the term "liquid coolant" may be any sufficiently non-conductive liquid such that electrical components (e.g., a motherboard, a memory board, and other electrical and/or electronic components designed for use in air) continue to reliably function while submerged without significant modification. A suitable liquid coolant is a dielectric liquid coolant, including without limitation vegetable oil, mineral oil (otherwise known as transformer oil), or any liquid coolant have similar features (e.g., a non-flammable, non-toxic liquid with dielectric strength better than or nearly as comparable as air.

As used herein, "fluid" means either a liquid or a gas, and "cooling fluid" means a gas or liquid coolant typically used for heat-rejection or cooling purposes. As used herein, a liquid coolant is a subset of the universe of cooling fluids, but a cooling fluid may be a dielectric or non-dielectric liquid or gas, such as, for example, a conventional air conditioning refrigerant.

PUE means "power usage effectiveness", which is a ratio of the total power used by a data center divided by the power used by the server, and is a measure of energy efficiency.

COP means the "coefficient of performance", a ratio of heat removed to work used. For instance, a COP of 10 would mean that 10 Watts of heat are removed using 1 Watt of work.

VCC means "vapor compression cycle", the thermal process most commonly used for air conditioning.

Poor overall efficiency of heretofore commercially available cooling technologies contributes to overall costs of cooling servers used by data centers. As disclosed herein, applicants have discovered that the irreversibilities contributing to this poor overall efficiency can be reduced, reducing the overall cost of cooling servers (as well as the corresponding cost of operating data centers).

As between two bodies (or fluids) at different temperatures, heat flows from the higher-temperature body to the lower-temperature body. For a given amount of transferred heat, such heat transfer is less irreversible (e.g., the associated energy retains more "usefulness," or is of a "higher quality") when both temperatures are higher as compared to a heat transfer process occurring at lower temperatures. Methods, systems, and apparatus are disclosed for efficiently cooling heat-generating electronic components, as by transferring heat from the components at a first temperature (e.g., about 158° F. in some instances) to a liquid coolant at a "high" temperature (e.g., a dielectric liquid coolant such as, for example, mineral oil at a temperature of, for example, about 105° F.). Such heat transfer from the heat-generating components at the first temperature to a coolant at a "high" temperature can be less irreversible than transferring the same quantity of heat from the components at the first temperature to a coolant at a "low" temperature (e.g., air at a temperature of, for example, 65° F.).

The methods, systems, and apparatus disclosed herein take advantage of this thermodynamic principle to improve the overall efficiency of cooling electronic components, as can be applied to, for example, independently operable servers of the type commonly used in a data center. Such improved cooling efficiency can reduce the overall cost of operating a data center by reducing electricity consumed for cooling purposes.

In some disclosed embodiments, the reduced temperature differences (resulting in lower irreversibility) allows for heat to be recaptured. In other embodiments, the reduced temperature differences reduces (or altogether removes) the need for refrigeration. In all of the disclosed embodiments, the corresponding cooling cycle efficiency of the cooling system increases as compared to conventional, commercially available cooling cycles.

Overview

Figure 1B:
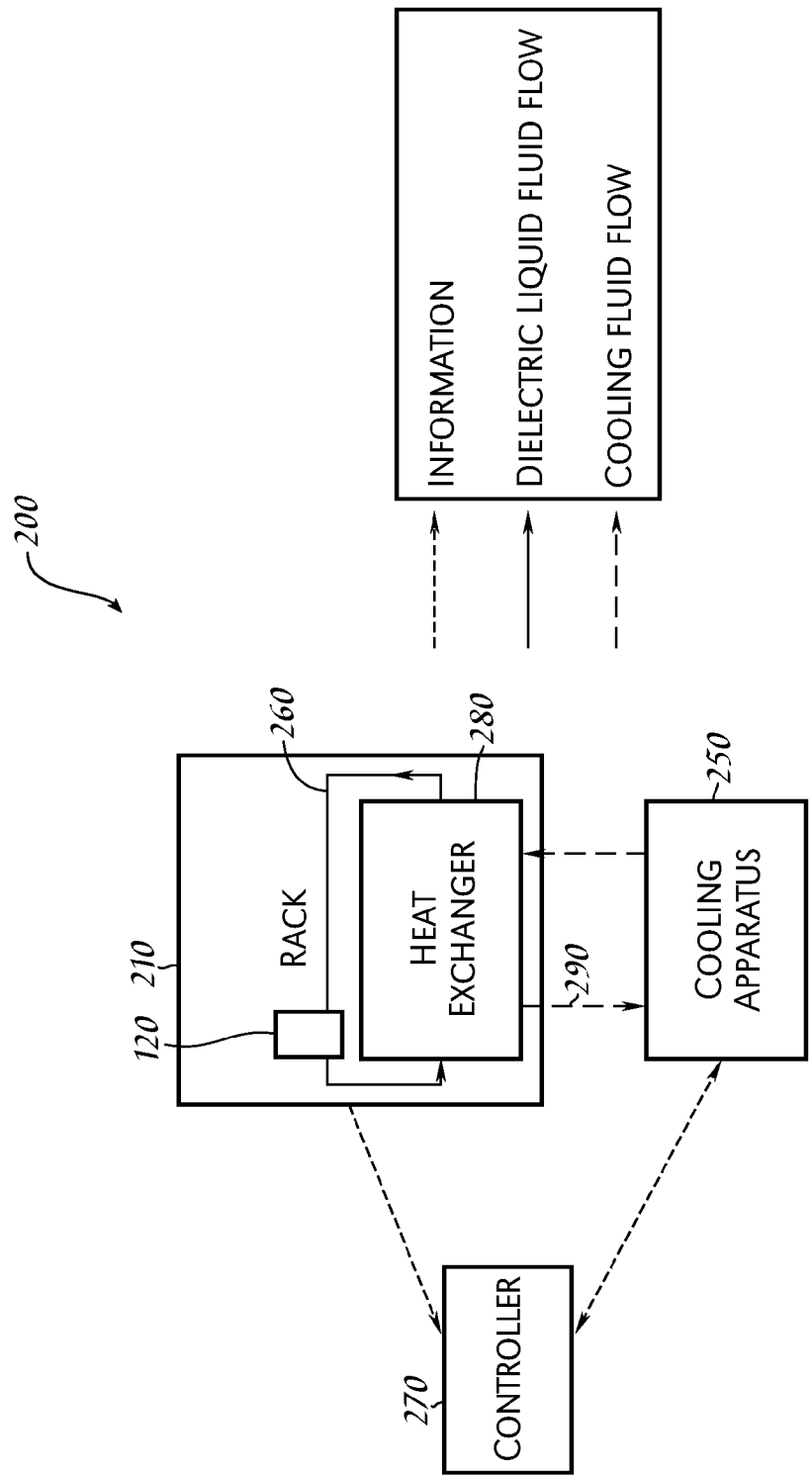
FIG. 1B illustrates an alternative embodiment of an exemplary system for efficiently cooling a plurality of independently operable servers.

FIG. 1A and FIG. 1B depict alternative exemplary systems 100 and 200, respectively, for cooling one or more independently operable servers containing heat-generating electronic components, such as can be arranged in one or more server racks, for example, in a data center. Some disclosed systems and methods reduce the temperature difference between heat generating (or dissipating) components and a cooling medium (also referred to herein as "coolant" or "liquid coolant") used to cool the components by maintaining a coolant temperature (e.g., an average bulk fluid temperature) at an acceptably elevated temperature compared to conventional cooling technologies. Such an elevated coolant temperature can reduce the power consumed for cooling purposes (e.g., heat can be more readily rejected from a "high-temperature" coolant to the environment than from a "low-temperature" coolant).

FIG. 1A illustrates one embodiment of cooling system 100 for cooling a rack of independently operable servers. The system 100 includes a tub or tank 110 containing a dielectric liquid coolant into which a plurality of servers 120 may be immersed. Mounting members or rails to be described hereinafter are positioned within the interior volume of the tank 110 and are configured to receive and mount the plurality of servers 120 as a rack of servers into the tank 110. Such a tank 110 may have an opening for access to each of the servers mounted in the rack. At least a portion of each server 120 is submerged within the dielectric liquid coolant for sufficiently cooling each respective server when the tank 110 is sufficiently full of the liquid coolant. Preferably, each of the servers during operation is completely submerged within the dielectric liquid coolant.

The liquid coolant heated by the servers 120 in the server rack is then fluidly coupled through suitable piping or lines to a pump 130, which pumps the heated liquid coolant through suitable piping or lines to a remotely or distally located heat exchanger 140 associated with a heat-rejection or cooling apparatus 150. The distally heat exchanger 140 rejects the heat from the incoming heated liquid coolant and fluidly couples the cooled liquid coolant through a return fluid line or piping 170 back into the tank 110. Thus, at least a portion of the liquid coolant completes a fluid circuit through the servers 120 in the tank 110, pump 130, heat exchanger 140, and back into the tank 110. The heat rejected from the heated liquid coolant through the heat exchanger 140 may then be selectively used by alternative heat rejection or cooling apparatus 150 to be described hereinafter to dissipate, recover, or beneficially use the rejected heat depending on the different environmental conditions and/or server operating conditions to which the system is subject.

The system 100 includes a computer controller 180 of conventional design with suitable novel applications software for implementing the methods of the present invention. The controller 180 may receive monitor signals of various operational parameters from various components of the cooling system 100 and the environment and may generate control signals to control various components of the cooling system to maintain the heated liquid coolant exiting the servers in the tank at a specific elevated temperature in order to sufficiently cool each of the servers while reducing the total amount of energy needed to cool the servers. Particularly, the controller 180 monitors the temperature of the liquid coolant at at least one location within the fluid circuit, for example where the heated liquid circuit exits the plurality of servers. The controller 180 may also monitor the temperature of the heat-generating electronic components in the servers in the server racks by electrically connecting the controller 180 to the diagnostic output signals generated by conventional rack-mountable servers. The controller may also monitor the flow of the dielectric liquid coolant. Based upon such information, the controller 180 may output signals to the pump 130 and heat rejection or cooling apparatus 150 to adjust the flow of the liquid coolant through the fluid circuit and the amount of the heat being rejected by the heat rejection or cooling apparatus 150 for sufficiently cooling each respective server while maintaining the heated liquid coolant exiting the servers at the elevated temperature to reduce the amount of energy consumed to sufficiently cool each of the servers in the server rack.

FIG. 1B illustrates one embodiment of an alternative cooling system 200 for cooling a rack of independently operable servers. The system 200 includes a tub or tank 210 containing a liquid dielectric coolant into which a plurality of servers 120 (not shown) can be immersed. Mounting members to be described hereinafter are positioned within the interior volume of the tank 210 and are configured to receive and mount the plurality of servers 120 as a rack of servers into the tank 210. Such a tank 210 may have an open top for access to each of the servers mounted in the rack. At least a portion of each server 120 is submerged within the dielectric liquid coolant for sufficiently cooling each respective server when the tank 210 is sufficiently full of the liquid coolant. Preferably, each of the servers during operation is completely submerged within the dielectric liquid coolant.

Unlike the cooling system 100, heated dielectric liquid coolant does not flow outside the tank 210. Instead, the fluid circuit 260 of the flowing dielectric liquid coolant is completely internal to the tank 210. A thermal coupling device 280, such as a heat exchanger, is mounted within the tank 210 within the fluid circuit through the servers so that at least a portion of the heated dielectric liquid coolant flow exiting the servers flows through the thermal coupling device 280. Cooled dielectric liquid coolant exits the coupling device 280 and at least a portion of the cooled dielectric coolant circulates in the internal fluid circuit 260 back through the servers.

The system 200 includes a secondary heat rejection or cooling apparatus 250 having a cooling fluid, such as a gas or liquid flowing in piping or lines, forming a second fluid circuit 290 wherein the secondary cooling apparatus 250 includes an associated remotely or distally located heat exchanger (not shown) that rejects heat from the cooling fluid in the second fluid circuit through the distally remote heat exchanger.

The heat rejected from the heated cooling fluid in the second fluid circuit through the heat exchanger associated with the secondary cooling apparatus 250 may then be selectively dissipated, recovered, or beneficially used depending on the different environmental conditions and/or server operating conditions to which the system is subject.

The system 200 includes a computer controller 270 with suitable novel applications software for implementing the methods of the present invention. The controller 180 may receive monitor signals of various operational parameters from various components of the cooling system 200 and the environment and may generate control signals to control various components of the cooling system to maintain the heated liquid coolant exiting the servers in the tank 210 at a specific elevated temperature in order to sufficiently cool each of the plurality of servers while reducing the total amount of energy needed to cool the servers. Particularly, the controller 270 monitors the temperature of the liquid coolant at at least one location within the internal fluid circuit, for example, where the heated liquid circuit exits the servers immersed in the tank. The controller 270 may also monitor the temperature of the heat-generating electronic components in the servers in the server racks by electrically connecting the controller to the diagnostic output signals generated by conventional rack-mountable servers, The controller may also monitor the flow and temperature of the cooling fluid in the external fluid circuit 290. Based upon such information, the controller 180 may output signals to the heat rejection or cooling apparatus 250 to adjust the flow of the cooling liquid through the external fluid circuit and the amount of the heat being rejected by the heat rejection or cooling apparatus 250 for sufficiently cooling each respective server while maintaining the heated liquid coolant exiting the servers at the elevated temperature to reduce the amount of energy consumed to sufficiently cool each of the servers. Preferably, the elevated temperature is a temperature significantly higher than the typical comfortable room temperature for humans and lower than the maximum permissible temperature of the most sensitive heat generating electronic component in the servers.

As previously described, a computer controller is used control different components of the cooling system to maintain the exiting dielectric liquid coolant temperature at an acceptable elevated temperature. By maintaining the existing coolant at an elevated level, the cooling system may be used with a number of different techniques for using or dissipating the heat (e.g., heat recapture, low power heat dissipation, or refrigeration).

In some embodiments, an average bulk fluid temperature of the coolant can be maintained at a temperature of about, for example, 105° F., which is significantly higher than a typical room temperature, as well as the maximum average outdoor temperature by month in the U.S. (e.g., about 75° F. during summer months). At a temperature of about 105° F., heat can be rejected to the environment (e.g., the atmosphere or nearby cooling sources such as rivers) with little power consumed, or recaptured as by, for example, heating the same or an adjacent building's hot-water supply or providing indoor heating in cold climates.

By maintaining a coolant temperature in excess of naturally occurring temperatures, irreversibilities and/or temperature differences present in a server cooling system may be reduced. A reduction in irreversibilities in a thermodynamic cycle tends to increase the cycle's efficiency, and may reduce the overall power consumed for cooling the servers.

In a conventional cooling system, about one-half watt is consumed by the cooling system for each watt of heat generated in a component. For example, a cooling medium (e.g., air) can be cooled to about 65° F. and the components to be cooled can operate at a temperature of about, for example, 158° F. This large difference in temperature results in correspondingly large inefficiencies and power consumption. In addition, the "quality" of the rejected heat is low, making the heat absorbed by the cooling medium difficult to recapture after being dissipated by the component(s). However, with a cooling medium such as air, such a large temperature difference may be necessary in conventional systems in order to achieve desired rates of heat transfer.

For example, one-dimensional heat transfer, $Q_{1-D}$, can be modeled as the quotient of a temperature difference, $\Delta T$, divided by a thermal resistance, $R_{th}$ $$\left(\text{i.e., } Q_{1-d} = \frac{\Delta T}{R_{ch}}\right).$$

Accordingly, for a given heat dissipation from a component, a temperature difference between the component and a stream of liquid coolant needs to be larger for higher thermal resistance than for a lower thermal resistance. Typically, a flow of gas (e.g., air) has a higher thermal resistance value than a flow of liquid (e.g., a dielectric liquid coolant).

Accordingly, a gas cooling fluid typically requires a larger temperature difference than a liquid coolant.

Illustrative Embodiments of the System and Apparatus

Figure 2:
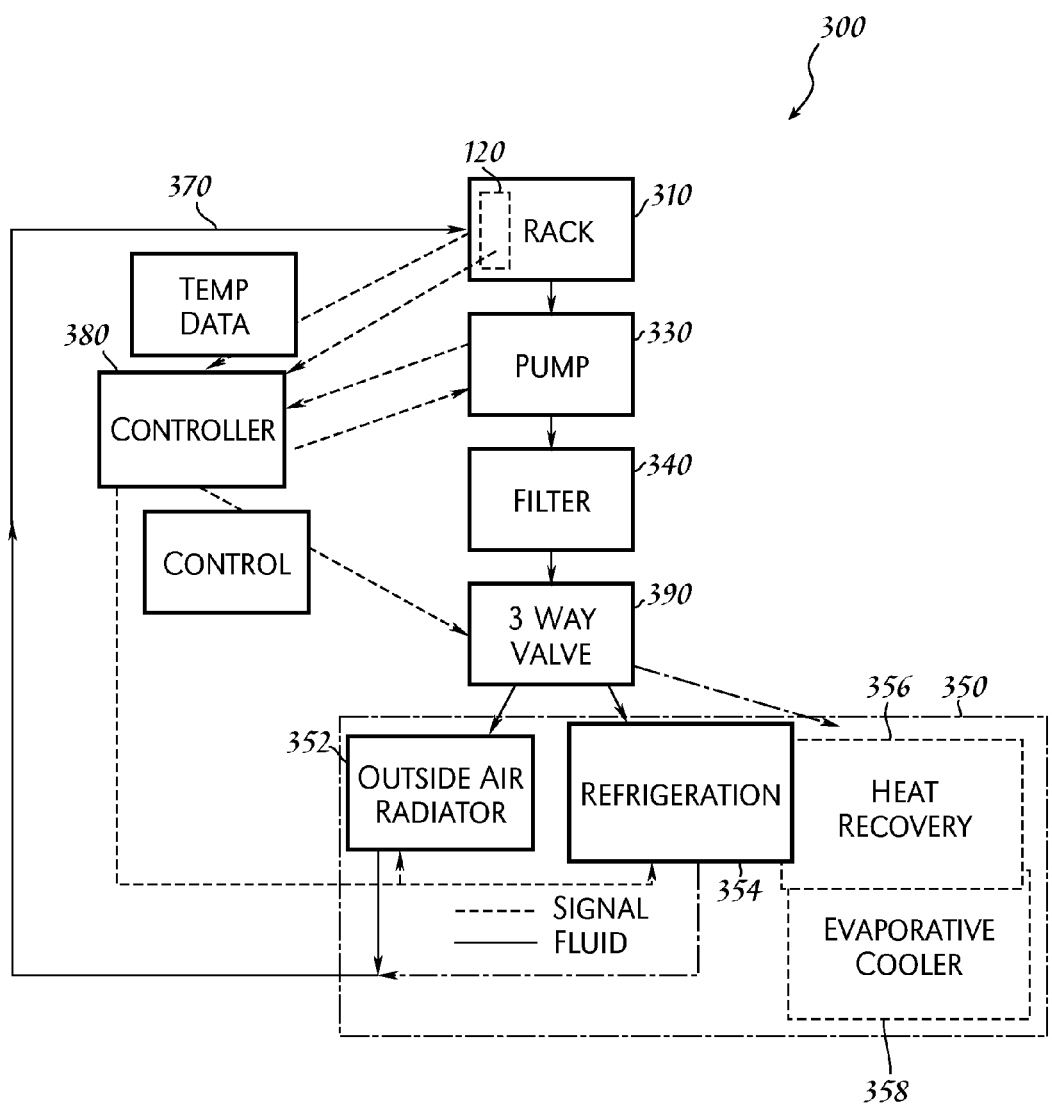
FIG. 2 illustrates the system of FIG. IA in more detail.

In FIG. 2, the cooling system 300 illustrates one embodiment of the cooling system 100 of FIG. 1A in more detail. The system 300 includes a tub or tank 310 containing a liquid coolant into which a plurality of servers 120 can be immersed. Mounting members to be described hereinafter are positioned within the interior volume of the tank 310 and are configured to receive and mount the plurality of servers as a rack of servers into the tank 310. Such a tank 310 may have an opening for access to each of the servers mounted in the rack. At least a portion of each server 120 is submerged within the liquid coolant for sufficiently cooling each respective server when the tank 310 is sufficiently full of the liquid coolant. Preferably, each of the servers during operation is completely submerged within the liquid coolant.

The liquid coolant heated by the servers 120 in the server rack is then fluidly coupled through suitable piping or lines to a pump 330, which pumps the heated liquid coolant through suitable piping or lines through a filter 360 to one or more fluid valves 390. The fluid valve 390 may be remotely controlled to connect the heated liquid coolant being pumped through the collection piping from the tank 310 to a controller-selected one of alternative remotely or distally located heat exchangers associated with alternative heat rejection or cooling apparatus 350, such as an outside air radiator 352 permitting cooling with outside ambient atmospheric air, a refrigeration system 354, a heat recovery system 356, or an evaporative cooler 358. The distally located heat exchanger associated with a selected one of the alternative heat rejection or cooling apparatus 350 then rejects the heat from the incoming heated liquid coolant and fluidly couples the cooled liquid coolant through a return fluid line or piping 370 back into the tank 310. Thus, at least a portion of the liquid coolant completes a fluid circuit through the servers 120 in the tank 310, pump 330, a heat exchanger associated with a heat-rejection apparatus 350, and back through piping 370 into the tank 310. The heat rejected from the heated liquid coolant through the heat exchanger may then be used by the selected one of alternative heat rejection or cooling apparatus 350 to dissipate, recover, or beneficially use the rejected heat depending on the different environmental conditions and/or server operating conditions to which the cooling system 300 is subject.

The cooling system 300 includes a computer controller 380 with suitable applications software which may receive monitor signals of various operational parameters from various components of the system 300 and the environment and may generate control signals to control various components of the system 300 to maintain the heated liquid coolant exiting the servers in the tank at a specific elevated temperature in order to sufficiently cool each of the plurality of servers while reducing the total amount of energy needed to cool the servers. Similar to previous embodiments, the controller 380 monitors the temperature of the liquid coolant at at least one location within the fluid circuit, for example where the heated liquid coolant exits the plurality of servers. The controller may also monitor the temperature of the heat-generating electronic components in the servers 120 in the server racks by electrically connecting the controller 380 to the diagnostic output signals generated by conventional servers. The controller 380 may also monitor the flow of the liquid coolant through the tank and/or fluid circuit. Based upon such information, the computer controller may output signals to the pump 330 and heat rejection or cooling apparatus 350 to adjust the flow of the liquid coolant through the fluid circuit and the amount of the heat being rejected by the heat rejection or cooling apparatus 350 for sufficiently cooling each respective server when the tank 310 is sufficiently full of the liquid coolant while maintaining the heated liquid coolant exiting the servers at the elevated temperature to reduce the amount of energy consumed to sufficiently cool each of the plurality of servers. In addition, the controller 380 also may operate an optimization program within the applications software as discussed hereinafter to determine which of the alternative heat rejection apparatus 350 connected to the fluid valve 390 provides the most efficient means of rejecting the heat from the heated liquid coolant given the environmental and server operating conditions. It should be noted, however, that the cooling system 300 does not necessarily require different methods of heat dissipation. In some instances it may be more cost effective to only have one.

Figure 3:
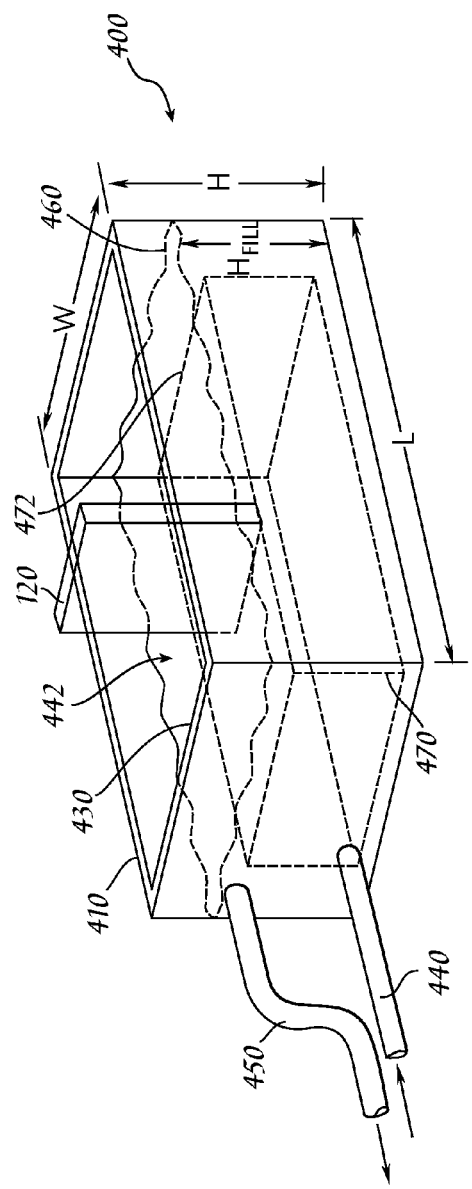
FIG. 3 illustrates a perspective view of an exemplary immersion-cooled rack having a plurality of independently operable servers mounted therein.
Figure 4:
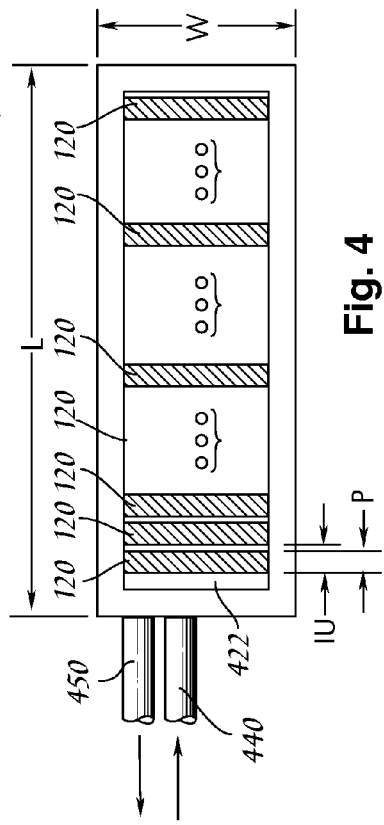
FIG. 4 illustrates a top plan view of the immersion-cooled rack shown in FIG. 3.

In FIGS. 3 thru 6, a suitable fixture or rack apparatus 400 for immersing a rack of independently operable servers in a liquid coolant 422 is depicted. The apparatus 400 includes a tub or tank 410 and mounting members for mounting the servers, as will be described in more detail hereinafter. The tank 410 may be fabricated of steel, a sufficiently strong plastic that is compatible with the dielectric liquid coolant used as a cooling medium, or other suitable material. The tank 410 may face upward with an open top 430 to form an open interior volume and may be shaped to have a length L, width W, and height H with the minimum footprint to insert multiple servers 120. Suitable mounting members may be used to mount the servers in the tank to form the server rack 470 within the tank. The tank 410 may be shaped and the L, W, and H dimensions sized such that multiple standard-sized servers, typically measured in units of "U" or 1.75 inches (as shown in FIG. 4), can be supported without significant modification.

The tank is fabricated to have an inlet pipe or line 440 from a piping system connected to a heat exchanger for the flow of lower temperature or cooled liquid coolant into the tank 410 and an outlet pipe or line 450 connected to collection piping for the flowing or pumping of heated coolant out of the tank to the external heat exchanger associated with one or more of the heat-rejection or cooling systems described in connection with FIGS. 1A, 1B, and 2.

The server rack itself may have a number of different implementations. Preferably, the mounting members are configured to mountably receive the plurality of servers in a vertical orientation, thereby minimizing the footprint of the servers relative to the ground, and with the "front"[1] panel facing upward for easy installation and removal of a server without the need to remove or disturb any other server within the tank 410.

[1] Upwards is defined as one of the two smallest sides of a rectangular computer. The "back" is generally referred to as the side with wires inserted, such as power, communications, etc.

The mounting members may be also configured to mount the servers such that the top level 460 of the liquid coolant completely submerges the top level 472 of the server rack 470 formed by the multiple servers 120. As a consequence, a volume of liquid coolant collects in a common manifold area above the server rack 470 to improve the circulation of the liquid coolant through the plurality of servers, thereby enhancing the cooling of each respective server. The mounting members may also be configured to mount the servers in the server rack 470 above the bottom of the tank to create a volume of liquid coolant between each respective server and the bottom of the tank such that the flow of the dielectric liquid coolant through the servers is improved. Preferably, the mounting members are configured to mount the servers closely adjacent to one another in the server rack to restrict the flow of the dielectric liquid coolant between the vertically-oriented servers, such that the flow of the dielectric liquid coolant through the servers is enhanced.

A pump, such as pump 330 in FIG. 2, may pump liquid coolant from the external heat exchanger through the piping system into the tank 410 to maintain coolant fluid circulation within the tank. The liquid coolant may flow through each installed server and exit at the server side positioned opposite the inlet to the tank. In FIGS. 3 thru 6, the inlet piping 440 is located at one end of the rectangular tank 410 near the bottom of the tank; whereas the outlet piping 450 is located nearer the top of the tank. This configuration permits the liquid coolant heated by the heat generating components in the servers to naturally rise through the servers and exit through the top or "front panel" of the servers.

The servers may be configured to minimize mixing of the incoming liquid coolant with outgoing liquid coolant. Each tank may be shaped (or have a member installed) to reduce the flow of coolant around the installed server (e.g., to reduce by-pass flow), thereby improving coolant flow over each heat generating component and/or respective heat sink in each of the multiple servers.

Alternatively, the location of the piping 440 and 450 may be reversed such that the heated liquid coolant may exit from the installed servers through its "rear" panel) into the outlet into the collection piping system. The collection piping transports the heated liquid coolant to the heat exchanger for rejecting at least some of the heat absorbed from the installed servers.

In another alternative rack design (not shown in the drawings), the tank 410 is divided into a plurality of bins with each bin being sized to receive one corresponding server with the "front panel" facing upward. The external pump pumps coolant from the external heat exchanger through the piping system into each bin to maintain a coolant fluid circulation within the tank and each respective bin. The liquid coolant may flow through each installed server and exit at a side positioned opposite the inlet to the tank and/or inlet to the bin. In addition, each bin may be configured to minimize mixing of the incoming liquid coolant with outgoing liquid coolant. Each bin may be shaped (or have a member installed) to reduce the flow of coolant around the installed server (e.g., to reduce by-pass flow), improving coolant flow over each heat-generating component and/or respective heat sink in each of the servers.

Figure 7:
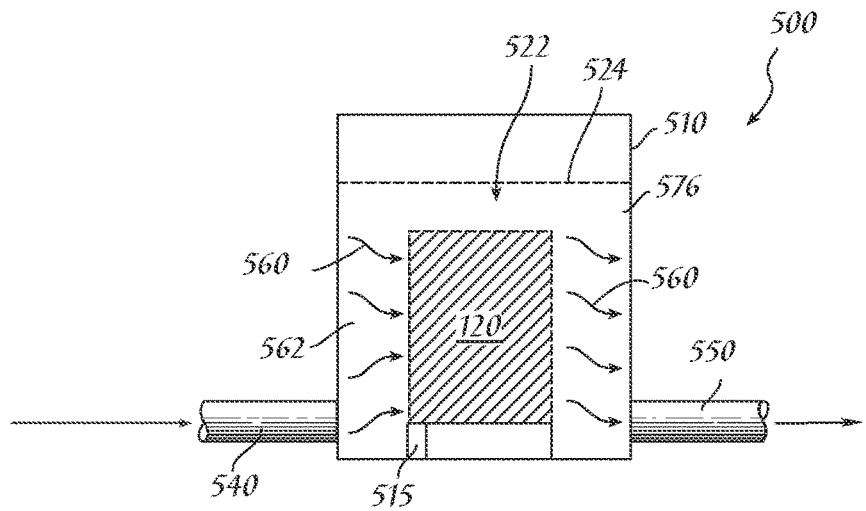
FIG. 7 illustrates an end elevation view of an alternative immersion-cooled rack having a plurality of independently operable servers installed therein.
Figure 8:
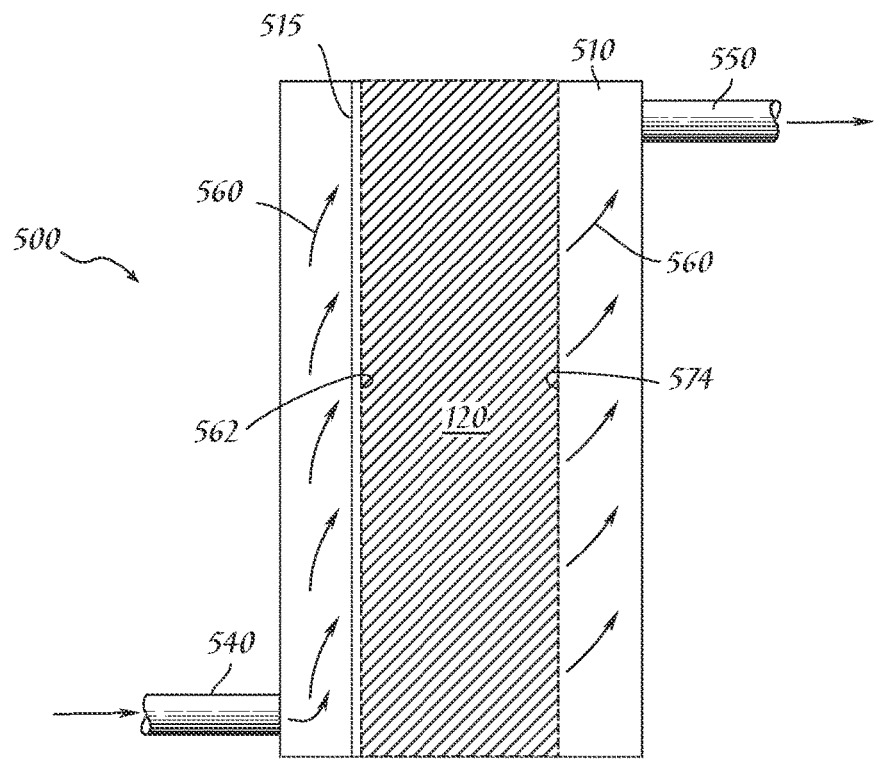
FIG. 8 illustrates a top plan view of the immersion-cooled rack shown in FIG. 7.

FIGS. 7 and 8 depict another illustrative embodiment of a suitable fixture or server rack apparatus 500 for immersing a rack of independently operable servers in a liquid coolant 522 wherein the surface of the liquid coolant 524 is above the top of the server rack. FIG. 7 shows an end elevation view of the apparatus 500, which includes a tub or tank 510 mounted on a mount 515 into which the servers 120 are submerged. The tank 510 may have an open top to form an open interior volume into which the servers may be mounted in a vertical orientation with the front panel facing upward toward the open top of the tank. The tank 510 is shaped and sized like the embodiment shown in FIGS. 3-6 except as otherwise noted herein below. The inlet piping 540 is located near one end of one of the longer sides of the rectangular tank near the bottom of the tank. The output piping 550 is located at the opposite end of the opposing longer side of the rectangular tank also near the bottom of the tank. In this configuration, the fluid flow 560 of the liquid coolant entering the tank through the inlet piping is initially through the volume 562 of liquid coolant formed by the longer side of the tank containing the inlet piping 540 and the side 572 of the server rack 570 of servers 120 and then through the side 572 of the server rack through the servers 120 and out the opposite side 574 of the server rack into a volume 576 of liquid coolant formed by the side 574 of the server rack and the longer side of the tank containing the outlet piping 550.

Figure 9:
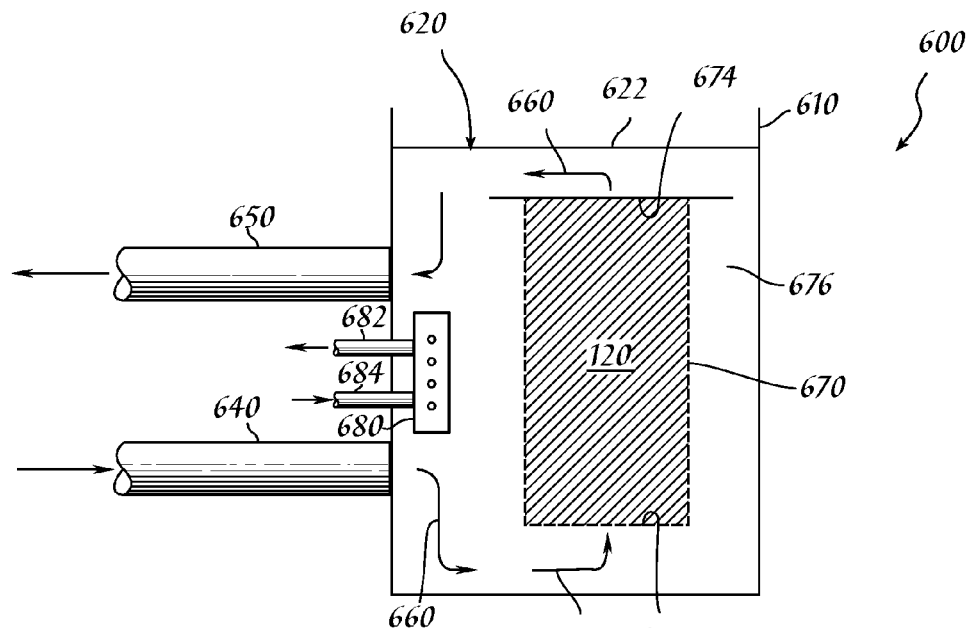
FIG. 9 illustrates an end elevation view of another alternative immersion-cooled rack having a plurality of independently operable servers mounted therein.

FIG. 9 depicts an end elevation view of yet another illustrative embodiment of a suitable fixture or server rack apparatus 600 for use in connection with a combination of system 100 of FIG. 1A and system 200 of FIG. 1B. In such a combination, there are two alternative modes of operating the cooling system for cooling the dielectric liquid coolant wherein the controller may switch the mode of operation depending on the environmental conditions. The tank 610 is shaped and sized like the embodiment shown in FIGS. 3-6 except as noted herein below. The tank 610 also may have an open top to form an open interior volume into which the servers may be mounted in a vertical orientation with the front panel facing upward toward the open top of the tank. The inlet piping 640 is located nearer one end of one of the longer sides of the rectangular tank than the middle and is located nearer the bottom of the tank than the middle. The output piping 650 is located nearer the opposite end of the same longer side of the rectangular tank nearer the top of the tank. In the first mode of operation utilizing a mode of operation comparable to that of FIG. IA, the fluid flow 660 of the liquid coolant entering the tank through the inlet piping 640 is initially through the space 662 formed by the bottom of the side of the tank containing the inlet piping 640 and the bottom 672 of the server rack 670 of servers 120 and then through the bottom 672 of the server rack through the servers 120 and out the front panel side 674 of the server rack into a space 676 formed by the top 674 of the server rack and the top surface 622 of the liquid coolant and nearer the outlet piping 650. To permit the second mode of operation similar to FIG. 1B, a second heat exchanger 680 associated with an additional secondary cooling apparatus is mounted within the tank 610 and a second inlet piping 682 and a second output piping 684 are inserted through the wall of the tank 610 and fluidly coupled to the heat exchanger to permit the flow of a separate second cooling fluid through the input piping 682, second heat exchanger 680, and outlet piping 684 back to the second secondary cooling apparatus.

In the second mode of operation, the pump associated with the first mode of operation is deactivated by the controller such that the fluid circuit flow of the dielectric liquid coolant to the external heat exchanger of the first secondary cooling apparatus is deactivated. Next the internal heat exchanger 680 associated with the second alternative secondary cooling apparatus is activated by the controller. In this mode the fluid flow of the dielectric fluid within the tank is reconfigured such that the heated dielectric liquid coolant fluid flow 660 flowing out of the servers 120 does not flow out of the outlet piping 650. Instead, at least a portion of the liquid coolant fluid flow 660 is through the heat exchanger 680 to the bottom of the tank 610 and then back through the servers 120. The heat rejected from the heat exchanger 680 is thermally coupled to the second cooling fluid of the second secondary cooling system for dissipation or recovery.

Figure 10:
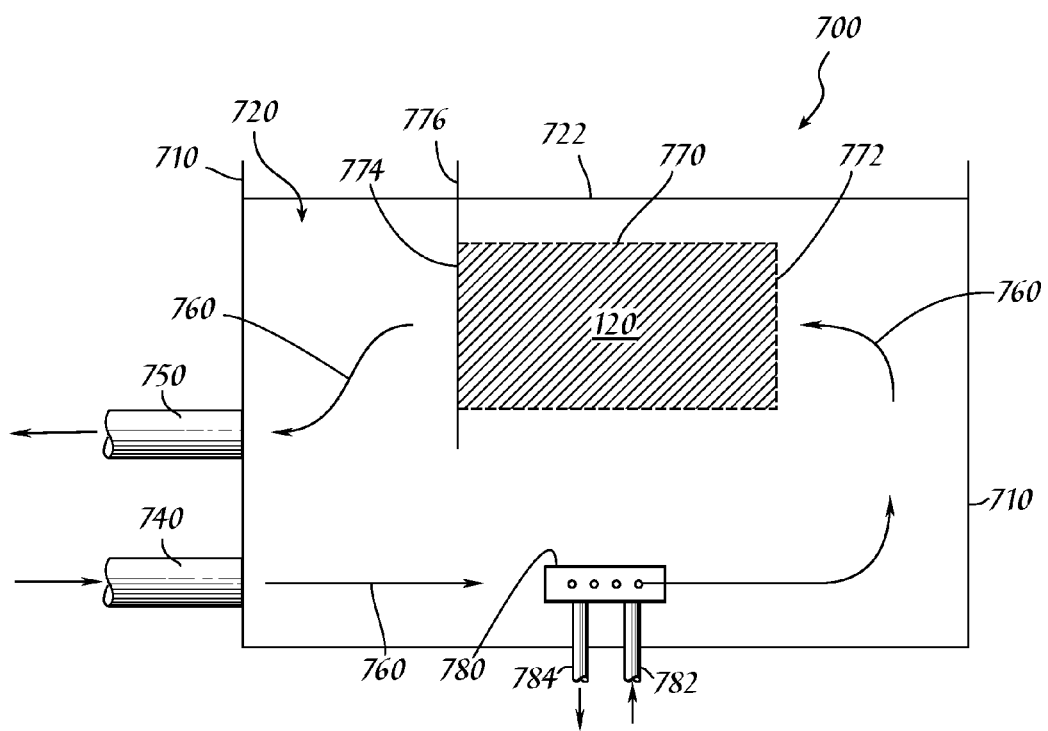
FIG. 10 illustrates an end elevation view of yet another alternative immersion-cooled rack having a plurality of independently operable servers mounted therein.

FIG. 10 depicts an end elevation view of yet another illustrative embodiment of a suitable fixture or server rack apparatus 700 for use in connection with a combination of system 100 of FIG. 1A and system 200 of FIG. 1B. In such a combination, there are two different modes of operating the cooling system for cooling the dielectric liquid coolant. The tank 710 is shaped and sized like the embodiment shown in FIGS. 3-6 except as noted herein below. The tank 710 also may have an open top to form an open interior volume into which the servers 120 may be mounted in a horizontal orientation with the front panel facing toward the shorter side of the rectangular tank in which the inlet piping 740 is located. The inlet piping 740 is located nearer one end of one of the shorter sides of the rectangular tank than the middle and is located nearer the bottom of the tank than the middle. The output piping 750 is located nearer the opposite end of the same shorter side of the rectangular tank nearer the top of the tank. In the first mode of operation utilizing a mode of operation comparable to that of FIG. 1A, the fluid flow 760 of the liquid coolant entering the tank through the inlet piping 640 is initially through the space 762 formed by a longer side of the tank and the lower side 772 of the server rack 770 of servers 120 and then through the bottom 772 of the server rack through the servers 120 and out the front panel 774 of the server rack into a space 776 formed by the front 774 of the server rack and the shorter side of the tank nearer the outlet piping 750. To permit the second mode of operation similar to FIG. 1B, a second heat exchanger 780 associated with an additional secondary cooling apparatus is mounted within the tank 710 and a second inlet piping 782 and a second output piping 784 are inserted through the wall of the tank 710 and fluidly coupled to the heat exchanger to permit the flow of a separate second cooling fluid through the input piping 782, second heat exchanger 780, and outlet piping 784 back to the second secondary cooling apparatus.

In the second mode of operation, the pump associated with the first mode of operation is deactivated by the controller such that the fluid circuit flow of the dielectric liquid coolant to the external heat exchanger of the first secondary cooling apparatus is deactivated. Next the internal heat exchanger 780 associated with the second alternative secondary cooling apparatus is activated by the controller. In this mode the fluid flow of the dielectric fluid within the tank is reconfigured such that the heated dielectric liquid coolant fluid flow 760 flowing out of the servers 120 does not flow out of the outlet piping 750. Instead, at least a portion of the liquid coolant fluid flow 760 is through the heat exchanger 780 to the bottom of the tank 710 and then back through the servers 120. The heat rejected from the heat exchanger 780 is then thermally coupled to the second cooling fluid of the second secondary cooling system for dissipation or recovery.

A combination of the system 100 and 200 using the alternative server rack apparatus of FIG. 9 and FIG. 10 that permit two different modes of operating the server rack cooling system for cooling the dielectric liquid coolant may be useful in certain applications and climates, for example, in an arid climate having cool nights and very hot days. During the cool days, the combination system employing the embodiments of FIG. 9 or FIG. 10 may be used in a first mode similar to that of FIG. 1A wherein the dielectric fluid is fluidly coupled to an external heat exchanger associated with a radiator-type secondary cooling system. During the hot days, the combination system may be used in a second mode similar to that of FIG. 1B wherein the dielectric liquid coolant is fluidly coupled through the internal heat exchanger, which is associated with a second secondary cooling apparatus, such as a vapor-compression cycle refrigeration cooling system.

Figure 11:
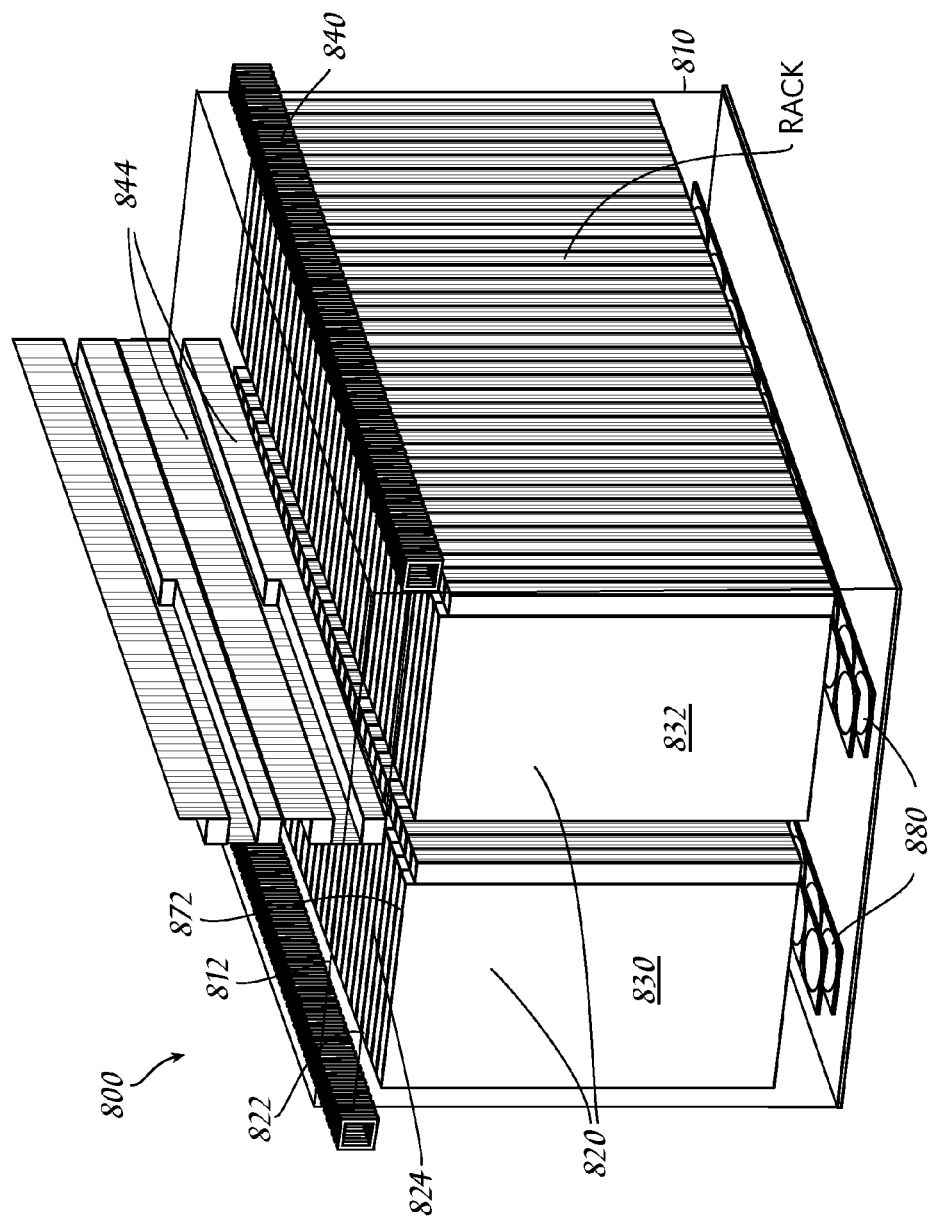
FIG. 11 illustrates a perspective view of side-by-side immersion-cooled racks having a plurality of independently operable servers mounted therein with the electrical connections to the servers shown.

FIGS. 11, 13 and 14 depict another illustrative embodiment of a suitable fixture or rack apparatus 800 for immersing side-by-side immersion-cooled server racks of standard commercially available versions of independently operable servers, such as those depicted in FIG. 12A for example, in a liquid coolant 822 with the electrical connections to the servers shown. The tank 810 may face upward with an open top 812 to form an open interior volume and may be shaped to have a length L, width W, and height H with the minimum footprint to insert two rows or racks 830 and 832 of multiple servers 820. The tank 810 may be shaped and the dimensions sized such that multiple standard-sized servers 820, typically measured in units of "U" or 1.75 inches (as shown in FIG. 12A), can be supported in two racks without significant modification. Suitable mounting members may be used to mount the servers in the tank to configure the server rack 830 and 832 within the tank. Specifically, the mounting members (not shown) may be fixedly attached along the length L of each longer side of the tank 810 and in the middle of the tank 810 between the two shorter ends of the tank to support the rack ears 836 of a standard rack-mountable server 820 shown in FIG. 12A.

The tank may be fabricated to have an inlet pipe or line from a piping system connected to a heat exchanger for the flow of lower temperature or cooled liquid coolant into the tank 810 and an outlet pipe or line connected to collection piping for the flowing or pumping of heated coolant out of the tank to the distally located heat exchanger as shown in FIG. 3. After the two racks of multiple servers are mounted inside the tank 810, the level 824 of the liquid coolant 822 may be carefully controlled to adjust the amount of flow of the liquid coolant through the multiple servers and to adjust the amount of heat removal from the heat generating electronic components in the servers.

Orienting the servers in a vertical orientation with the front panel facing upward may also be advantageous due to the typical movable hard drive installation in a standard commercially available server. When a standard server such as shown in FIG. 12A, is oriented vertically the hard drive 890 of such a server, as shown in FIG. 12B, is oriented vertically with the cables connecting at the bottom of the drive. In some embodiments, a liquid-resistant or liquid-proof enclosure 892 for the movable hard-drive 890 in each of the servers 820 can be inserted over the hard-drives prior to the submersion of the server into the dielectric liquid coolant to protect moving components (e.g., a platen) from being damaged by the viscous liquid coolant. The previously inserted liquid-proof enclosure traps air within the hard drive. The entrapped air prevents the dielectric liquid coolant from entering the portion of the disk drive containing the movable disk.

As shown in FIG. 13, the apparatus 800 also may have cable trays 840 mounted along two sides of the tank 810 paralleling the sides of the server racks 830 and 832 to organize the signal and control network cabling 842 from the servers to the controller and other computers in the data center and beyond. The apparatus 800 may further have power distribution units ("PDUs") 844 mounted above the space between the server racks in order to distribute needed electrical power through suitable power cables 846 to the multiple servers.

The server racks 830 and 832 may have a number of different implementations, some of which affect the flow characteristics of the liquid coolant. Preferably, the mounting members are configured to mountably receive the plurality of servers in a vertical orientation, thereby minimizing the footprint of the servers relative to the ground, and with the "front"[2] panel facing upward for easy installation and removal of a server without the need to remove or disturb any other server within the tank 810.

[2] Upwards is defined as one of the two smallest sides of a rectangular server. The "back" is generally referred to as the side with wires inserted, such as power, communications, etc.

As shown in FIGS. 12 and 14, the mounting members may be also configured to mount the servers such that the top level 824 of the liquid coolant 822 completely submerges the top level 872 of the server rack 830 and 832 formed by the multiple servers 820. As a consequence, a volume of liquid coolant collects in a common manifold area above each of the servers to improve the circulation of the liquid coolant through the plurality of servers, thereby enhancing the cooling of each respective server. The mounting members may also be configured to mount the servers in the server rack 830 and 832 above the bottom of the tank 810 to create a volume of liquid coolant between each respective server 820 and the bottom of the tank such that the flow of the dielectric liquid coolant through the plurality of servers is improved. Preferably, the mounting members are configured to mount the servers closely adjacent to one another in the server rack to restrict the flow of the dielectric liquid coolant between the plurality of vertically-oriented servers, such that the flow of the dielectric liquid coolant through the plurality of servers is enhanced.

The tank may also be sized and shaped to minimize the mixing of the cool and heated liquid coolant. Further the apparatus 800 may include a removable top so that in the event of fire the top of the fixture apparatus may be enclosed to smother the fire.

A pump, such as the pump 330 of FIG. 2, may pump liquid coolant from the external heat exchanger through the piping system into the tank 810 to maintain the coolant fluid flow within the tank. The liquid coolant may flow through each installed server and exit through the outlet pipe from the tank. Similar to FIGS. 3 thru 6, the inlet piping may be located at one end of the rectangular tank 810 near the bottom of the tank; whereas the outlet piping may be located nearer the top of the tank. This configuration permits the liquid coolant heated by the heat generating components in the servers to naturally rise through the servers and exit through the front panel of the servers. Because the flow is relatively low in comparison to the total volume of the container, the fluid conducts to be relatively uniform temperature.

Alternatively, the location of the inlet and outlet piping may be reversed such that the heated liquid coolant may exit from the installed servers through its "rear" panel) into the outlet into the collection piping system. The collection piping transports the heated liquid coolant to the heat exchanger for rejecting at least some of the heat absorbed from the installed servers.

In commercially available servers, fans are often installed within the servers for distributing a cooling medium (e.g., air) among components and regions within the server. In some embodiments, these fans can help distribute a liquid coolant among the components and regions within the servers. Coolant flow rate and/or fan-speed can be adjusted in response to a component temperature excursion above a pre-determined threshold, or even a computational workload, to maintain component temperatures at or below a maximum specified (as by, for example, the component manufacturer) temperature, while at the same time maintaining a coolant temperature at an elevated temperature, such as at the highest coolant temperature that still maintains component temperatures below a maximum threshold. Fan speed can be modulated, but does not have to be.

Additional fluid velocity augmentation devices, such as multiple fans 880 may be mounted under each of the server racks 830 and 832 in the volume of liquid coolant between the plurality of servers in each respective rack and the bottom of the tank to increase the mixing of the dielectric liquid coolant within the tank, and improving the flow of the coolant through the plurality of servers. Other suitable fluid augmentation devices include nozzles mounted on the end of a line from the cooling inlet piping which may be directed toward the desired entry point of the liquid coolant into the servers to enhance the fluid velocity of the liquid coolant through the servers.

FIG. 14 shows the fluid flow 860 of the liquid coolant 822 through the servers 820 in the apparatus 800 in more detail. For the server configuration shown, the fluid flow 860 of the liquid coolant entering the tank through the lower inlet piping is initially directed through a volume of liquid coolant 862 formed by the bottom of the side of the tank containing the inlet piping and the bottom 872 of the server rack 830 and 832 of servers 820 and then through the bottom 872 of the server rack through the servers 820 and out the top side 874 of the server rack into a volume of liquid coolant 876 formed by the top 874 of the server rack and the top surface 822 of the liquid coolant and near the outlet piping located near the top of the tank.

In summary, the immersion of servers into a liquid coolant within the fixture apparatus various embodiments 400, 500, 600, 700, and 800 of the fixture apparatus shown in FIGS. 3-14 reduces the temperature difference between server electronic components generating heat and the liquid coolant medium used to cool them. Preferably, the median coolant temperature can be kept at as high a level as possible while maintaining a component temperature during operation below its specified maximum allowable operating temperature. Such a high-temperature cooling medium provides sufficient cooling while reducing the power consumed to cool the electronic components, as compared to cooling the component with a lower-temperature cooling medium such as refrigerated air.

Therefore the fixture apparatus for submerging the servers in a dielectric liquid coolant provides for the following advantages:

- designed to maximize fluid temperature through flow control
- permits the use of standard commercially available rack mountable servers originally designed for air cooling with minimal modification from commercially available configurations
- transfers heat from all heat-generating components into the dielectric liquid coolant without the addition of cold plates, piping or additional parts internal to the servers
- has an open top which enables the removal of any server without the removal of a different server (e.g., servers remain independently operable)
- only requires the tank enclosure to be sealed rather than needing to hermetically seal each of the individual servers being mounted in the server racks
- guides the fluid flow such that cool liquid coolant flows in and heated liquid coolant flows out of the servers
- may use fluid velocity augmentation, such as fan speed modulation, to enhance the flow of the liquid coolant through each server
- improves the installed density of servers in a conventional server room or data center by minimizing the footprint of the servers relative to the ground uses a controller (i) to monitor temperature and flow conditions in the fixture apparatus and the power consumption of the servers and cooling system to minimize the amount of power required to cool the servers and (ii) to control the heat exchange method, thereby enabling the data center to recapture heat, if desirable, or dissipate the heat in the most efficient manner when heat recapture is not desirable.

Figure 15:
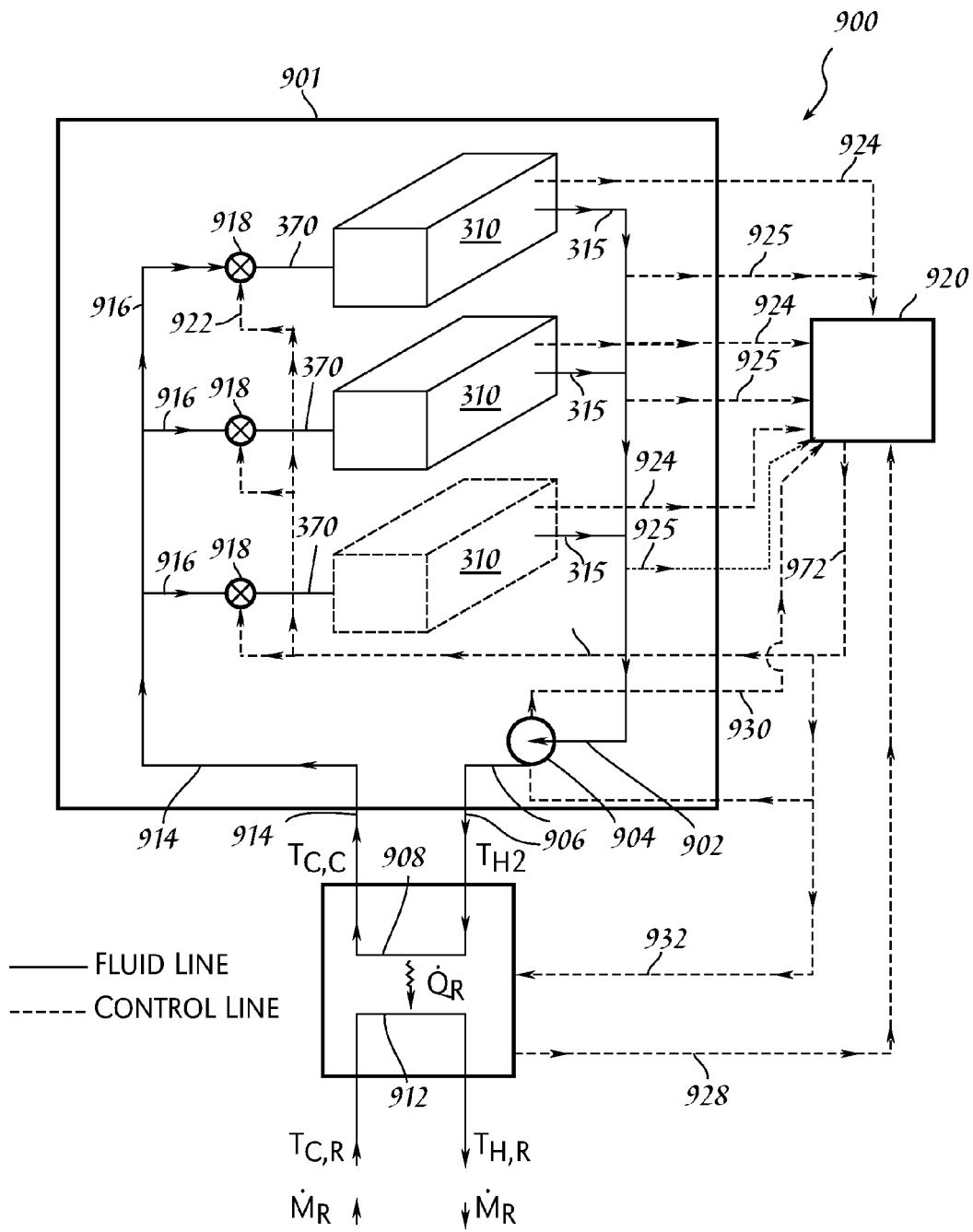
FIG. 15 is a schematic illustration of a system for cooling a plurality of immersion-cooled server racks of the type shown in, for example, FIG. 3 and installed in a server room.

FIG. 15 depicts a schematic illustration of a system for cooling multiple immersion-cooled server racks of the type shown in, for example, FIG. 3, located in a server room of a typical data center. The cooling system includes multiple server racks 310 fluidly coupled in parallel through respective outlet piping 315 to collection piping system 902. Collection piping 902 collects the heated liquid coolant flowing out of the multiple server racks. The collection piping 902, in turn, is fluidly coupled to a pump 904 which pumps the collected heated liquid coolant through piping 906 to a fluid line 908 in a heat exchanger 910. The heated liquid coolant in fluid line 908 is thermally coupled to a cooling fluid flowing in line 912 through heat exchanger 910. The cooling fluid in line 912, in turn, is coupled to a selected one of the heat rejection or cooling apparatus 352, 354, 356, etc as previously described for either dissipating or recovering the heat absorbed by the cooling fluid from the heated liquid coolant.

The cooled liquid coolant exiting from line 908 of the heat exchanger 910 is then fluidly coupled through distribution piping system 914 to a plurality of parallel piping 916 fluidly connected to valves 918. Valves 918, in turn, are fluidly connected in parallel to the inlet piping 370 to the multiple server racks 310.

The controller 920 may receive monitoring signals of the temperature of the heated liquid coolant exiting the server racks through control lines 924. The controller may also receive monitoring signals of the flow rate of the liquid coolant at various locations in the piping 902 through control lines 925 and the flow rate through the pump 904 through control lines 926. The controller 920 may also receive monitoring signals relating to the type of secondary cooling apparatus selected and the flow rate of the cooling fluid in the selected secondary cooling apparatus through control lines 928.

As previously described, the controller 920 operates an application program that processes the information received from the various monitoring signals to selected an optimum elevated temperature, the energy needed to be rejected by the system to cool the servers and maintain the elevated temperature, and then determine the various settings of the system 900 components that will be needed to maintain the elevated temperature of the liquid coolant exiting the servers in the multiple server racks 310. The various components of the system 900 controlled by the controller 920 include any fluid velocity augmentation devices positioned below the server racks, the pump 904, valves 918, the valve 390 (FIG. 2) for switching the flow of the heated liquid coolant between secondary cooling apparatus to be used, and the selected secondary cooling apparatus.

The controller may adjust the flow of the cooled liquid coolant through each of the valves 918 to adjust the volume of the flow of the cooled liquid coolant among the different server racks 310.

The controller 920 may control any fluid velocity augmentation devices in the server racks through control lines and may also control the pumping rate of the pump 904 through control line 930. In addition, the controller 920 through control line 932 may select one of a plurality of secondary cooling apparatus 352, 354, 356, etc to optimize the secondary cooling apparatus to the environmental and server rack conditions and control the amount of heat being rejected by the selected secondary cooling apparatus by adjusting the flow of the cooling fluid in the secondary cooling apparatus.

Methods of Operation

Figure 16:
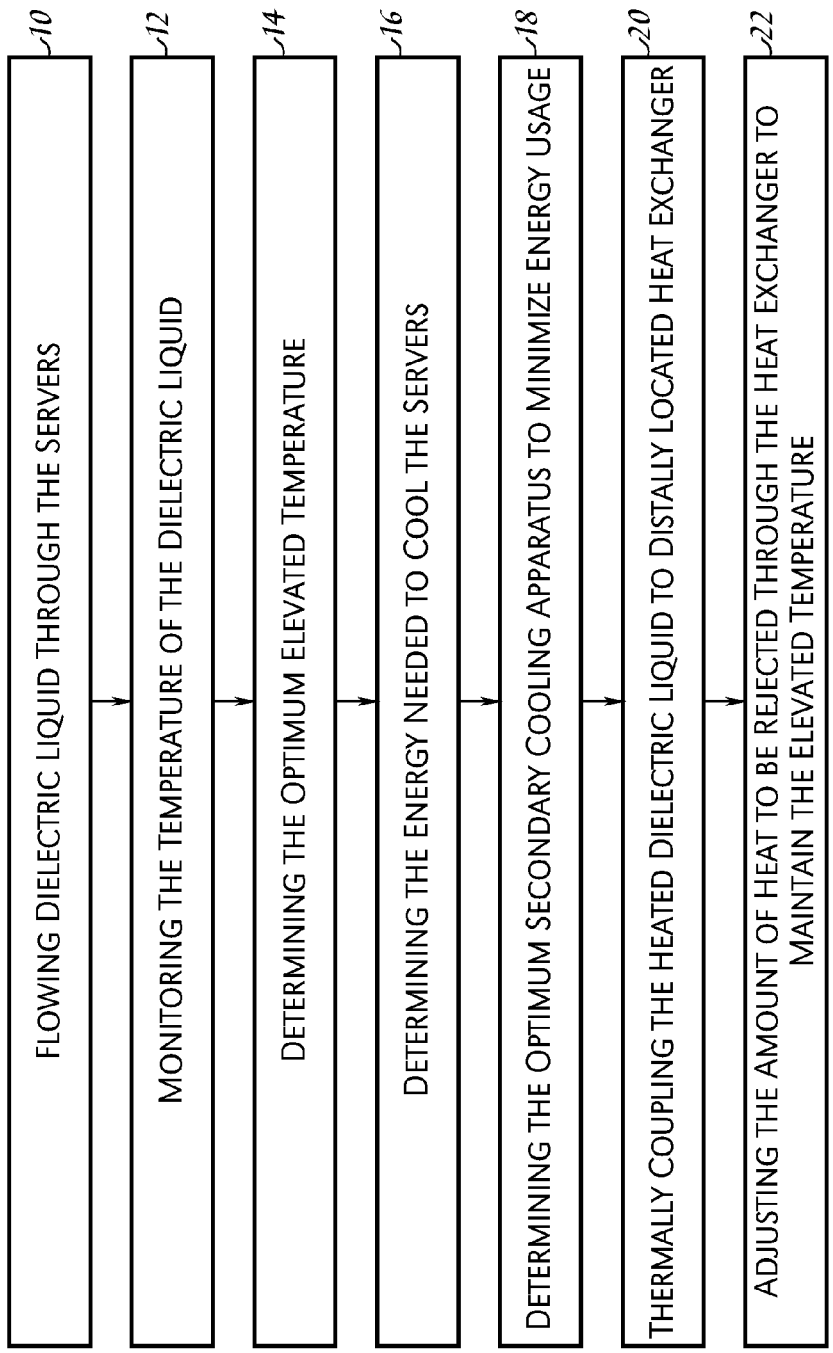
FIG. 16 illustrates an exemplary method of cooling one or more independently operable servers immersed in a tank of liquid coolant employing the systems of FIG. 1A or 1B.

FIG. 16 illustrates an exemplary method of cooling one or more independently operable servers at least partially immersed within a liquid coolant inside a tank with an open interior volume. This method may be used to implement the systems of FIG. 1A or 1B. The method includes a step 10 of flowing a dielectric liquid coolant in a fluid circuit through the plurality of servers immersed within the dielectric liquid coolant for absorbing at least a portion of any heat being dissipated by the servers. In step 12, the temperature of the liquid coolant at at least one location is monitored by a controller. In step 14, the controller determines what temperature would be the optimum elevated temperature of the heated dielectric liquid coolant as it exits the plurality of servers such that the exiting liquid coolant sufficiently cools the plurality of servers while reducing the amount of energy consumed to sufficiently cool each respective server. As previously described, the determined optimum elevated temperature preferably is a temperature significantly higher than the typical comfortable room temperature for humans and lower than the maximum permissible temperature of the most sensitive heat generating electronic component in the servers. In step 16, the controller periodically determines the energy needed to reject the heat absorbed by the liquid coolant and maintain the liquid coolant exiting the servers at the elevated temperature. In step 18, the optimum secondary cooling apparatus to minimize the amount of energy needed to be consumed to maintain the elevated temperature and cool the servers is selected. In step 20, the liquid coolant heated by the servers is thermally coupled to a heat exchanger. In step 22, a portion of the heat absorbed by the liquid coolant from the servers is rejected through the heat exchanger. In step 24, in response to the energy consumption periodically determined, the amount of heat rejected through the heat exchanger is periodically adjusted such that the liquid coolant exiting the plurality of servers at the elevated temperature sufficiently cools the plurality of servers while reducing the amount of energy consumed to sufficiently cool each respective server.

It should be noted that it may be desirable to also monitor (i) the temperature of the liquid coolant at multiple locations, (ii) the flow rate of the liquid coolant through the fluid circuit; (iii) the temperature of the electronic components of the respective servers by connecting the temperature signals outputted by standard commercially available servers to the controller; and the power consumption of the servers through signals outputted from the servers to the controller.

In response to the energy consumption periodically determined and the flow rate, the controller may periodically adjust the pumping rate of the liquid coolant through the pump and the heat exchanger such that the liquid coolant exiting the servers at the elevated temperature sufficiently cools the plurality of servers while reducing the amount of energy consumed to sufficiently cool each respective server.

In connection with the operation of the cooling system depicted in FIG. 1A and further depicted in FIG. 2, the heat exchanger for directly rejecting heat from the liquid coolant is located externally to the fixture apparatus and the method employs a first type of thermodynamic cycle. In this embodiment, the step of thermally coupling the liquid coolant to a heat exchanger includes the step of fluidly coupling the liquid coolant to a distally located heat exchanger and the flow of the liquid coolant passes through outlet piping in the tank into a fluid circuit that is partially outside the tank. A more detailed description of the steps occurring in this embodiment is set forth below in connection with the description of FIGS. 17A and 17B.

In connection with the operation of the cooling system 200 in FIG. 1B, the coupler, such a heat exchanger, for directly rejecting heat from the heated liquid coolant flowing through the servers 120 is located internally to the tank 210. The method of operation of this system 200 employs a second type of thermodynamic cycle. In this alternative system embodiment, the method include the steps of flowing at least a portion of the cooler liquid coolant in a first fluid portion of a first liquid circuit through each of the plurality of servers wherein the liquid coolant exiting the plurality of servers is heated to an elevated temperature; thermally coupling the heated liquid coolant through a coupler to a cooling fluid located in a first portion of a second fluid circuit; fluidly coupling the heated cooling liquid in the first portion of the second fluid circuit to an external distally located heat exchanger for rejecting at least a portion of the heat coupled through the second liquid circuit from the heated dielectric liquid coolant; fluidly coupling the cooled cooling fluid from the distally located heat exchanger through a second portion of the second liquid circuit to the coupler; thermally coupling the cooled cooling fluid through the coupler to the first portion of the first liquid circuit.

This method may also include the steps of monitoring the flow rate of the cooling fluid in the second fluid circuit; and monitoring the temperature of at least one of the heat-generating electronic components in each respective server; periodically determining the energy needed to cool the servers by the cooling of the heated cooling fluid to the cooler temperature. This method may also include the step of enhancing the fluid velocity of the dielectric fluid through the servers using fluid velocity augmentation devices, such fans or nozzles, as previously described herein.

In response to the controller periodically determining the energy needed to reject the absorbed heat and the flow rate of the cooling liquid, the method may also include the step of periodically adjusting the flow rate of the cooling liquid through the second fluid circuit such that the liquid coolant exiting the servers at the elevated temperature sufficiently cools the servers while reducing the amount of energy consumed to sufficiently cool each respective server. The method may further include the steps of monitoring the temperature of the cooling fluid in the second fluid circuit.

It should be noted that in the system employing the second type of thermodynamic cycle, the flow of the liquid coolant is contained inside the tank in which the servers are submerged. Preferably the fluid flow in this first fluid circuit is from the bottom of the server through the server to the top thereof, where heated liquid coolant exists. Once the coolant exits the top of the server, the coolant is cooled by passing it through the heat exchanger in the liquid coolant. Once cooled, the liquid coolant sinks to the bottom of the tank. The flow of the coolant in the first fluid circuit can be supplemented by fans, internal or external to the servers. In the preferred embodiment, cooling takes place near the exiting of the heated coolant from the servers.

Figure 17A:
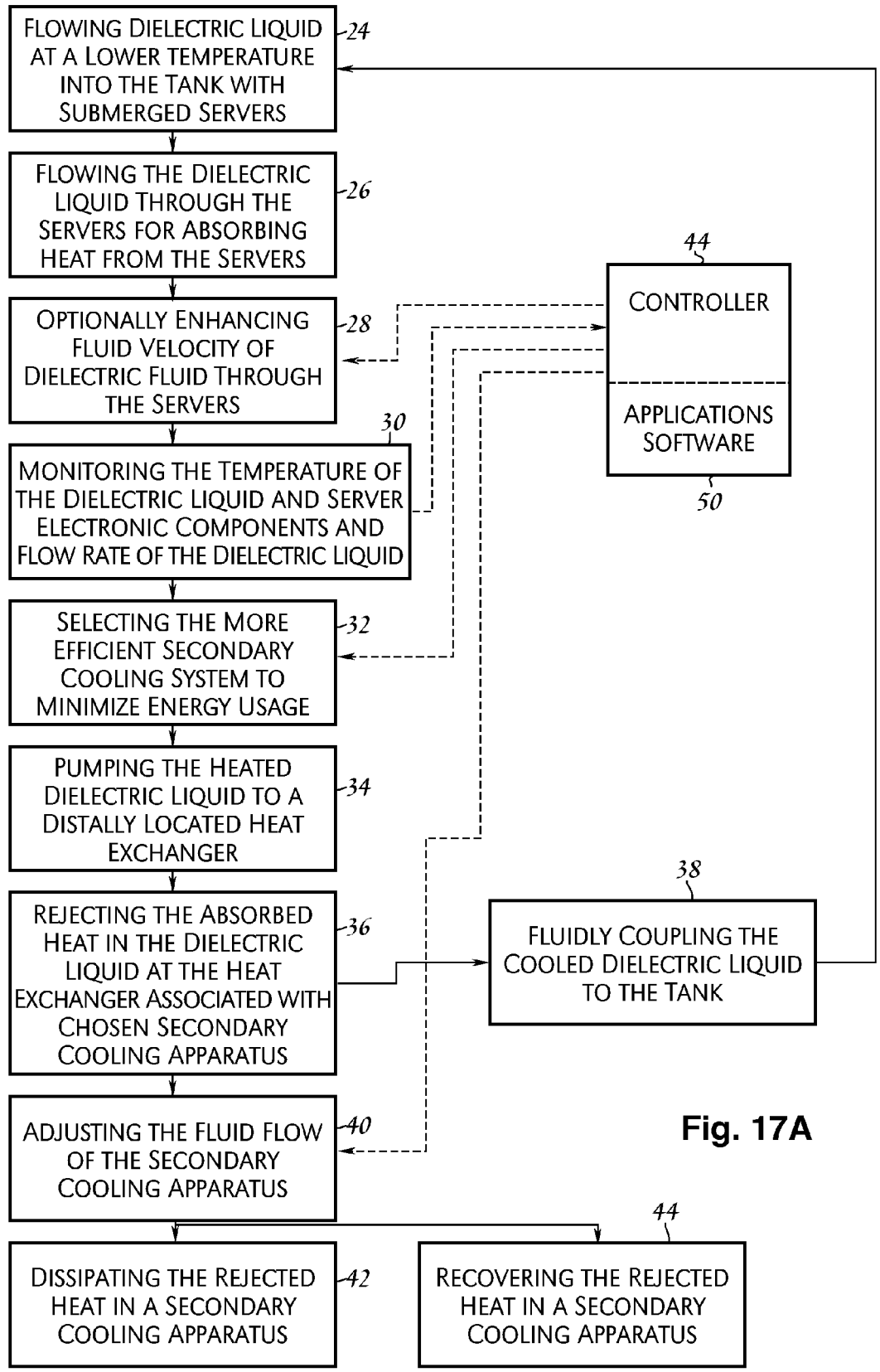
FIG. 17A illustrates the physical steps in the method of cooling one or more independently operable servers immersed in a tank of liquid coolant employing the system of FIG. 1A.

FIG. 17A illustrates the physical steps in the method of cooling one or more independently operable servers immersed in tank of liquid coolant employing the system of FIG. 1A or FIG. 3. In step 24 of the method, liquid coolant flows into the tank with the servers. In step 26, the dielectric liquid coolant flows in a fluid circuit through the plurality of servers immersed within the dielectric liquid coolant for absorbing at least a portion of any heat being dissipated by the servers. In step 28, the fluid velocity of the liquid coolant may be optionally enhanced by using fluid velocity augmentation devices, such as fans, in and outside of the servers. In step 30, the temperature of the liquid coolant is monitored at least one location within the fluid circuit. In step 32, a secondary cooling system is selected to minimize energy usage. In step 34, the liquid coolant heated by the servers pumped to a heat exchanger distally located from the tank. In step 36, at least a portion of the heat absorbed by the liquid coolant is rejected through the heat exchanger. In step 38, the cooled liquid coolant is fluidly coupled back to the tank. In step 40, the fluid flow in the secondary cooling apparatus is adjusted to aid in maintaining the elevated temperature. In step 42, the rejected heat is dissipated through the selected secondary cooling apparatus or in step 44, the rejected heat is recovered by the selected secondary cooling apparatus.

Figure 17B:
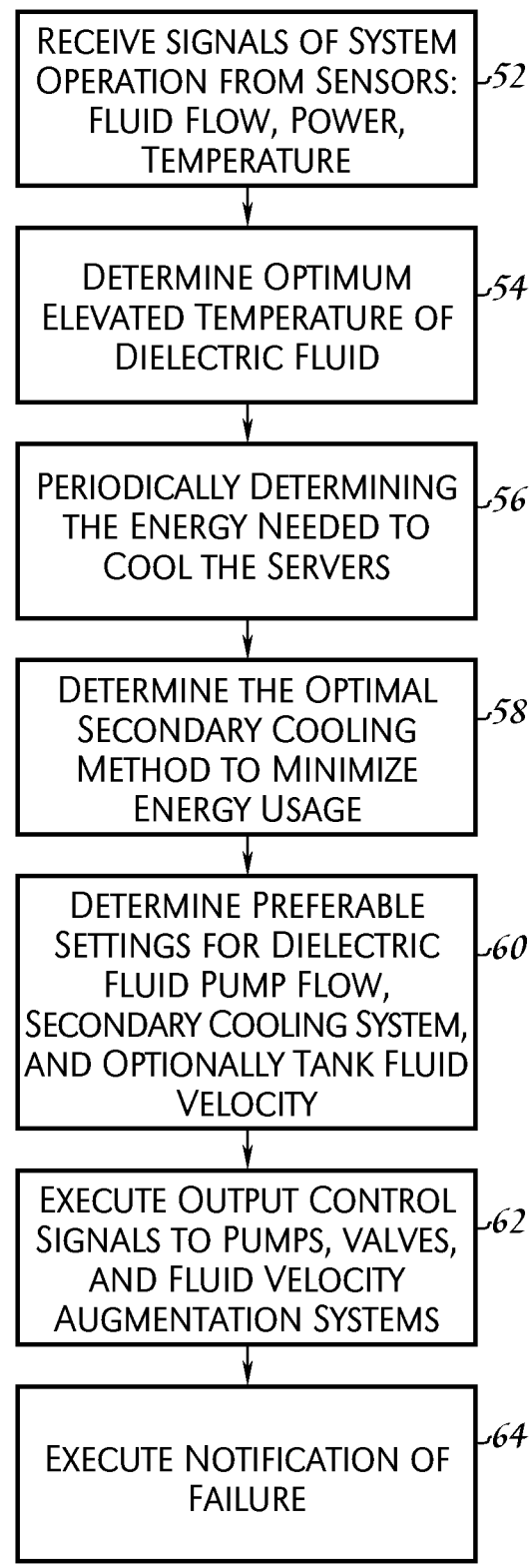
FIG. 17B illustrates the computer controller-based steps in the method of cooling one or more independently operable servers immersed in a tank of liquid coolant employing the system of FIG. 1A.

FIG. 17B illustrates the computer controller-based steps in the method of cooling one or more independently operable servers immersed in tank of liquid coolant employing the system of FIG. 1A or FIG. 3. In step 52, the controller receives signals relating to the system operation from various sensors relating to temperature, fluid flow, and power consumption. In step 54, the controller determines the optimum elevated temperature for cooling the servers. In step 56, the controller periodically determines the energy needed to cool the plurality of servers. In response to the energy consumption periodically determined, the controller in step 58 periodically determining the optimal secondary cooling method to minimize energy usage in order to adjust the amount of heat to be rejected through the heat exchanger such that the liquid coolant exiting the plurality of servers at the elevated temperature sufficiently cools the plurality of servers while reducing the amount of energy consumed to sufficiently cool each respective server. In step 60, the controller determines the preferable settings for the dielectric liquid coolant pump, type of secondary cooling apparatus, and optionally the fluid velocity of the liquid coolant in the tank. In step 62, the controller executes the output control signals to the pumps, valves, and fluid velocity augmentation systems, i.e. fans or nozzles. In step 64, the controller provides a failure notification in the event the system fails to operate as planned. For example the controller provides a failure notification is there is a safety issue or the system is down for any reason.

In summary, the implementation of the methods disclosed in the exemplary alternate embodiments described herein for cooling server racks immersed in a dielectric liquid coolant by maintaining an elevated temperature can minimize the amount of power required to cool the servers. This accomplished by taking advantage of the number of irreversibilities or temperature differences present in a normal server cooling system that can be reduced to improve cooling efficiency. The reduction of temperature differences between the incoming cool liquid coolant and the heated outgoing liquid coolant is made possible by:

controlling the amount of liquid coolant flow to each server by using speed modulated fluid velocity augmentation devices to ensure flow is sufficient to cool components with changing demand; and a controller maintaining coolant temperature at the maximum allowable temperature (e.g., between 90 and 130 degrees F.) by using the efficient heat removal methods described. The computer controller doesn't necessarily have to separate from the servers that are being cooled.

The reduction of irreversibilities in the thermodynamic cycle increases efficiency and therefore reduces overall power consumed. With the described features, it should be possible to safely maintain fluid temperatures at approximately 105 F, significantly higher than room temperature and the maximum US average outdoor temperature by month (75 degrees F. during summer). At this temperature, heat can be dissipated with minimum power or recaptured by heating other unrelated components such as building hot water or ambient indoor air in cold climates. Further, this method should minimize or remove the need for energy-intensive thermal processes associated with the current methods of server/computer cooling, which include refrigeration as the primary mode of heat dissipation. If heat dissipation (versus heat recapture) is desired, an elevated coolant temperature allows methods requiring up to ⅛ or less power than conventional refrigeration methods. These low energy methods can include direct fluid to air heat exchangers, evaporative cooling, or other similar methods. Refrigeration, however, can be used to supplement cooling methods disclosed herein while consuming a minimum power.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. An apparatus for cooling a plurality of rack-mountable servers containing heat generating electronic components, the cooling apparatus comprising:

at least one tank defining an open interior volume and having a coolant inlet for receiving a dielectric liquid coolant within the open interior volume and having a coolant outlet for allowing the dielectric liquid coolant to flow from the open interior volume, the coolant inlet and the coolant outlet being fluidly coupled to each other, wherein the at least one tank comprises an open or openable top sized to receive at least one row comprising a plurality of rack-mountable servers, each of at least two of the plurality of rack-mountable servers in the at least one row comprising a motherboard and heat producing components mounted to the motherboard;

one or more mounting members positioned within the interior volume and configured to mountably receive the plurality of rack-mountable servers within the interior volume, wherein the mounting members are configured to hold each of at least two of the rack-mountable servers in the at least one row in a horizontally stacked relationship with one another, with the rack-mountable servers in a vertical orientation such that one of the two smallest sides of the rack-mountable server faces upward and the motherboard of the rack-mountable server is vertically oriented, wherein at least two of the rack-mountable servers are independently operable from one another, wherein each of at least two of the rack-mountable servers is configured to connect to a computer network;

a volume of dielectric coolant at least partially held in the at least one tank; and a multi-circuit fluid cooling apparatus, wherein, when the vertically oriented rack-mountable servers are mountably received in at least one row in the at least one tank, at least a portion of at least two of the vertically oriented rack-mountable servers being mountably received are held in the at least one tank such that the vertically oriented rack-mountable servers are commonly at least partially submerged in the volume of the dielectric liquid coolant in the at least one tank for cooling the vertically oriented rack-mountable servers, wherein, when the vertically oriented rack-mountable servers are mountably received in the at least one tank and commonly at least partially submerged in the volume of dielectric liquid coolant in the at least one tank, the vertically oriented rack-mountable servers are thermally coupled to a remote heat exchanger via the external fluid circuit, wherein the multi-circuit fluid cooling apparatus comprises:

a dielectric liquid cooling apparatus;

a secondary cooling apparatus comprising the remote heat exchanger; and a liquid-to-liquid or liquid-to-refrigerant heat exchanger;

wherein the dielectric liquid cooling apparatus includes one or more pumps, and a plurality of fluid velocity augmentation devices in the volume of dielectric liquid coolant in the at least one tank, wherein at least one of the pumps, the coolant inlet, the coolant outlet, and the mounting members are configured such that the at least one pump moves at least a portion of the dielectric liquid coolant vertically across heat producing components on the vertically oriented motherboard of one of the vertically oriented rack-mountable servers in parallel flow with dielectric liquid coolant moved vertically across heat producing components on the vertically oriented motherboard of at least one other of the vertically oriented rack-mountable servers, wherein each of at least two of the fluid velocity augmentation devices is configured to increase upward fluid velocity of flow of dielectric liquid coolant through the vertically oriented rack-mountable servers or upwardly between adjacent ones of the vertically oriented rack-mountable servers, wherein the volume of dielectric liquid coolant comprises at least one passage in the tank that is outside of the vertically oriented rack-mountable servers, wherein, when the at least one pump is operated to move the dielectric liquid coolant vertically across the heat producing components on the vertically oriented motherboards, a circuit is formed in which a first portion of dielectric liquid coolant is moved vertically upward across the heat producing components on the vertically oriented motherboards and then downward outside of the rack mountable servers in the at least one passage, while a second portion of the dielectric liquid coolant flows out of the tank and through the liquid-to-liquid or liquid-to-refrigerant heat exchanger, wherein the liquid-to-liquid or liquid-to-refrigerant heat exchanger is configured to transfer heat from the second portion of dielectric liquid coolant in the circuit to liquid or refrigerant moving in the secondary cooling apparatus, wherein the secondary cooling apparatus is configured to reject, by way of the remote heat exchanger, at least part of the heat transferred from the second portion of the dielectric liquid coolant, wherein the vertically oriented rack-mountable servers are mountable in the at least one tank such that, when the vertically oriented rack-mountable servers are commonly at least partially submerged in the volume of dielectric liquid coolant in the at least one tank and the dielectric liquid coolant is moved within the at least one tank, at least one of the vertically oriented rack-mountable servers is independently vertically removable from the volume of dielectric liquid coolant in which the at least two vertically oriented rack-mountable servers are commonly at least partially submerged and from the at least one tank through the top of the tank while at least two of the other vertically oriented rack-mountable servers in the at least one row remain commonly at least partially submerged in the volume of dielectric liquid coolant in the at least one tank and the dielectric liquid coolant in the at least one tank continues to flow across heat producing electronic components of the at least two other vertically oriented rack-mountable servers remaining at least partially commonly submerged in the at least one row.

2. The apparatus of claim 1, wherein:
the one or more mounting members are configured to mountably receive the vertically oriented rack-mountable servers above the bottom of the at least one tank to form a volume between each respective vertically oriented rack-mountable server and the at least one tank to permit the flow of dielectric liquid coolant through the plurality of vertically oriented rack-mountable servers.

3. The apparatus of claim 1, wherein:
the vertically oriented rack-mountable servers have a plurality of rack ears;
the at least one tank comprises a tank which is sized to receive at least one row of the vertically oriented rack-mountable servers; and
the one or more mounting members comprises a plurality of mounting members fixedly attached to the at least one tank and configured to mountably receive the rack ears of the plurality of vertically oriented rack-mountable servers in the at least one row of vertically oriented rack-mountable servers to permit installation and removal of the at least one vertically oriented rack-mountable server without affecting the operational status of the other vertically oriented rack-mountable servers remaining within the at least one tank.

4. The apparatus of claim 1, further comprising:
at least one cable tray to receive and support signal and control network cabling to and from the plurality of vertically oriented rack-mountable servers; and
at least one power distribution unit to receive and support power distribution cables for distributing electrical power to the plurality of vertically oriented rack-mountable servers;
wherein the at least one cable tray and the at least one power distribution unit are mounted in proximity to the open top of the at least one tank so that the at least one vertically oriented rack-mountable server is independently removable from the tank through the open top of the tank without the need to remove the other vertically oriented rack-mountable servers from the tank or disturb the location or operational status of the other vertically oriented rack-mountable servers remaining within the tank.

5. The apparatus of claim 1, wherein at least one of the vertically oriented rack-mountable servers is vertically removable from the at least one tank without the need to disturb the operational status of the other vertically oriented rack-mountable servers remaining within the at least one tank.

6. The apparatus of claim 1, wherein at least one of the vertically oriented rack-mountable servers is vertically removable from the at least one tank without the need for horizontal detachment of the at least one rack-mountable server.

7. The apparatus of claim 1, wherein at least one of the vertically oriented rack-mountable servers comprises an enclosure, wherein flow of the dielectric liquid coolant around the vertically oriented rack-mountable servers is restricted such that flow through the enclosure of the at least one vertically oriented rack-mountable server is enhanced.

8. The apparatus of claim 1, wherein one or more of the vertically oriented rack-mountable servers are not attached to a lid for the apparatus.

9. The apparatus of claim 1, wherein the one or more mounting members comprise:
a first set of one or more mounting members coupled in a fixed relationship to the tank; and
a second set of one or more mounting members coupled in a fixed relationship to the tank,
wherein the first set of one or more mounting members and the second set of mounting members are spaced apart from one another to form at least one opening for receiving a row of two or more of the vertically oriented rack-mountable servers in a vertical orientation within the interior volume, wherein the at least one mounting member in the first set of mounting members supports at least one vertically oriented rack-mountable server of the vertically oriented rack-mountable servers on one side of the row and wherein at least one mounting member in the second set of mounting members supports the at least one vertically oriented rack-mountable server on the other side of the row.

10. The apparatus of claim 1, wherein the plurality of fluid velocity augmentation devices comprise a plurality of nozzles configured to direct dielectric liquid coolant from the coolant inlet piping toward a desired entry point into the vertically oriented rack-mounted servers to augment the fluid velocity of the liquid coolant through the vertically oriented rack-mounted servers.

11. The apparatus of claim 10, further comprising a line from the coolant inlet, wherein the plurality of nozzles are mounted on the line, wherein each of at least two of the plurality of nozzles are configured to direct dielectric liquid coolant toward a desired entry point into the vertically oriented rack-mounted servers to augment the fluid velocity of the liquid coolant through the vertically oriented rack-mounted servers.

12. The apparatus of claim 1, wherein at least two of the fluid velocity augmentation devices are mounted in the volume of dielectric liquid coolant between the at least one row of vertically oriented rack-mountable servers and bottom of the at least one tank such that the fluid velocity augmentation devices increase upward flow of the dielectric liquid coolant through or between the plurality of vertically oriented rack-mountable servers, wherein each of at least two of the fluid velocity augmentation devices is configured to increase upward fluid velocity of flow of dielectric liquid coolant in a different part of the volume of dielectric liquid coolant in which the at least two vertically oriented rack mountable servers are commonly at least partially submerged and upwardly through different ones of the vertically oriented rack-mountable servers or upwardly through a gap between different adjacent pairs of the fluid velocity augmentation devices rack-mountable servers.

13. The apparatus of claim 1, wherein at least one of the one or more pumps is configured to move a portion of the dielectric liquid coolant across heat producing electronic components of the other vertically oriented rack-mountable servers while the at least one of the plurality of vertically oriented rack-mountable servers is removed from the volume of dielectric liquid coolant.

14. The apparatus of claim 1, wherein, when the vertically oriented rack-mountable servers are mountably received in the at least one tank and the dielectric liquid coolant is moved within the at least one tank, heated dielectric liquid coolant at the surface of the volume of dielectric liquid coolant is moved crossways relative to the direction of the row of vertically oriented rack-mountable servers.

15. The apparatus of claim 1, further comprising a controller configured to:
    monitor one or more operational parameters of cooling of the vertically oriented rack-mountable servers;
    determine, based at least in part on at least one of the monitored operational parameters, an elevated temperature of dielectric liquid coolant exiting the vertically oriented rack-mountable servers, wherein the elevated temperature is selected to sufficiently cool each of the vertically oriented rack-mountable servers while reducing the total amount of energy need to cool the vertically oriented rack-mountable servers; and
    maintain dielectric liquid coolant exiting the vertically oriented rack-mountable servers at the selected elevated temperature.

16. The apparatus of claim 15, wherein the controller is configured to operate at least one of the one or more pumps to maintain dielectric liquid coolant exiting the vertically oriented rack-mountable servers at a temperature that is significantly higher than comfortable room temperature and lower than the maximum permissible temperature of the most sensitive heat generating electronic component of the vertically oriented rack-mountable servers.

17. The apparatus of claim 1, wherein the liquid-to-liquid heat exchanger or refrigerant-to-liquid heat exchanger is located on the at least one tank.

18. An apparatus for cooling a plurality of rack-mountable servers containing heat generating electronic components in a server room, the cooling apparatus comprising:
    at least one tank defining an open interior volume and having a coolant inlet for receiving a dielectric liquid coolant within the open interior volume and having a coolant outlet for allowing the coolant to flow from the open interior volume, the coolant inlet and the coolant outlet being fluidly coupled to each other, each of at least two of the plurality of rack-mountable servers in the at least one row comprising a motherboard and heat producing components mounted to the motherboard;
    one or more mounting members positioned within the interior volume and configured to mountably receive the plurality of rack-mountable servers within the interior volume, wherein the mounting members are configured to hold each of at least two of the rack- mountable servers in the at least one row in a horizontally stacked relationship with one another, with the rack-mountable servers in a vertical orientation such that one of the two smallest sides of the rack-mountable server faces upward and the motherboard of the rack-mountable server is vertically oriented, wherein at least two of the rack-mountable servers are independently operable from one another, wherein each of at least two of the rack-mountable servers is configured to connect to a computer network,
    a volume of dielectric coolant at least partially held in the at least one tank; and a multi-circuit fluid cooling apparatus,
    wherein, when the vertically oriented rack-mountable servers are mountably received in at least one row in the at least one tank, at least a portion of at least two of the vertically oriented rack-mountable servers being mountably received are held in the at least one tank such that the vertically oriented rack-mountable servers are commonly submerged in the volume of the dielectric liquid coolant in the at least one tank for cooling the vertically oriented rack-mountable servers,
    wherein, when vertically oriented rack-mountable servers are mountably received in the at least one tank and commonly at least partially submerged in the volume of dielectric liquid coolant in the at least one tank, the vertically oriented rack-mountable servers are thermally coupled to a remote heat exchanger outside of a server room in which the at least one tank is located via the multi-circuit fluid cooling apparatus, wherein the multi-circuit fluid cooling apparatus comprises:
    a dielectric liquid cooling apparatus;
    a secondary cooling apparatus comprising a remote heat exchanger; and
    a liquid-to-liquid or liquid-to-refrigerant heat exchanger;
    wherein the dielectric liquid cooling apparatus includes one or more pumps, and a plurality of fluid velocity augmentation devices in the volume of dielectric liquid coolant in the at least one tank, wherein at least one of the pumps, the coolant inlet, the coolant outlet, and the mounting members are configured such that the at least one pump moves at least a portion of the dielectric liquid coolant vertically across heat producing components on the vertically oriented motherboard of one of the vertically oriented rack-mountable servers in parallel flow with dielectric liquid coolant moved vertically across heat producing components on the vertically oriented motherboard of at least one other of the vertically oriented rack-mountable servers; and
    wherein each of at least two of the fluid velocity augmentation devices is configured to increase upward fluid velocity of flow of dielectric liquid coolant through the vertically oriented rack-mountable servers or upwardly between adjacent ones of the vertically oriented rack-mountable servers,
    wherein the volume of dielectric liquid coolant comprises at least one passage in the tank that is outside of the vertically oriented rack-mountable servers, wherein, when the at least one pump is operated to move the dielectric liquid coolant vertically across the heat producing components on the vertically oriented motherboards, a circuit is formed in which a first portion of dielectric liquid coolant is moved vertically upward across the heat producing components on the vertically oriented motherboards and then downward outside of the rack mountable servers in the at least one passage, while a second portion of the dielectric liquid coolant flows out of the tank and through the liquid-to-liquid or liquid-to-refrigerant heat exchanger, wherein the liquid-to-liquid or liquid-to-refrigerant heat exchanger is configured to transfer heat from the second portion of dielectric liquid coolant in the circuit to liquid or refrigerant moving in the secondary cooling apparatus, wherein the secondary cooling apparatus is configured to reject, by way of the remote heat exchanger, at least part of the heat transferred from the second portion of the dielectric liquid coolant.

19. The apparatus of claim 18, wherein, when the plurality of vertically oriented rack-mountable servers are mountably received, each respective rack-mountable server is completely submerged within the dielectric liquid coolant such that a volume of dielectric liquid coolant collects in a common manifold area above the plurality of rack-mountable servers to improve the circulation of the liquid coolant through or between the plurality of vertically oriented rack-mountable servers, thereby enhancing the cooling of the vertically oriented rack mountable servers.

20. The apparatus of claim 18, wherein the at least one tank comprises an open or openable top, wherein the vertically oriented rack-mountable servers are mountable such that at least one of the vertically oriented rack-mountable servers can be removed from the at least one tank through the open or openable top while at least two of the other vertically oriented rack-mountable servers remain commonly at least partially submerged in the dielectric liquid coolant and dielectric liquid coolant continues to flow across the at least two other vertically oriented rack-mountable servers.

21. The apparatus of claim 18, further comprising a controller configured to maintain dielectric liquid coolant exiting the vertically oriented rack-mountable servers at a temperature that is significantly higher than comfortable room temperature and lower than the maximum permissible temperature of the most sensitive heat generating electronic component of the vertically oriented rack-mountable servers.

22. An apparatus for cooling a plurality of rack-mountable servers containing heat generating electronic components in a server room, the cooling apparatus comprising:

at least one tank defining an open interior volume and having a coolant inlet for receiving a dielectric liquid coolant within the open interior volume and having a coolant outlet for allowing the coolant to flow from the open interior volume, the coolant inlet and the coolant outlet being fluidly coupled to each other, wherein the at least one tank comprises an open or openable top sized to receive at least one row comprising a plurality of rack-mountable servers, each of at least two of the plurality of rack-mountable servers in the at least one row comprising a motherboard and heat producing components mounted to the motherboard;

one or more mounting members positioned within the interior volume and configured to mountably receive the plurality of rack-mountable servers within the interior volume, wherein the mounting members are configured to hold each of at least two of the rack-mountable servers in the at least one row in a horizontally stacked relationship with one another, with the rack-mountable servers in a vertical orientation such that one of the two smallest sides of the rack-mountable server faces upward and the motherboard of the rack-mountable server is vertically oriented, wherein at least two of the rack-mountable servers are independently operable from one another, wherein each of at least two of the rack-mountable servers is configured to connect to a computer network, a volume of dielectric coolant at least partially held in the at least one tank; and a multi-circuit fluid cooling apparatus, wherein, when the vertically oriented rack-mountable servers are mountably received in at least one row in the at least one tank, at least a portion of at least two of the vertically oriented rack-mountable servers being mountably received is held in the at least one tank such that at least two of the vertically oriented rack-mountable servers can be commonly at least partially submerged in the volume of the dielectric liquid coolant in the at least one tank for cooling the vertically oriented rack-mountable servers, wherein, when the vertically oriented rack-mountable servers are mountably received in the at least one tank and commonly at least partially submerged in the volume of dielectric liquid coolant in the at least one tank, the vertically oriented rack-mountable servers are thermally coupled to a remote heat exchanger outside of the server room via the multi-circuit fluid cooling apparatus, wherein the multi-circuit fluid cooling apparatus comprises:

a dielectric liquid cooling apparatus; and a secondary cooling apparatus comprising a remote heat exchanger, wherein the dielectric liquid cooling apparatus includes one or more pumps, and a plurality of fluid velocity augmentation devices in the volume of dielectric liquid coolant in the at least one tank, wherein at least one of the pumps, the coolant inlet, the coolant outlet, and the mounting members are configured such that the at least one pump moves at least a portion of the dielectric liquid coolant in the volume of dielectric liquid coolant vertically across heat producing components on the vertically oriented motherboard of one of the vertically oriented rack-mountable servers in parallel flow with dielectric liquid coolant moved vertically across heat producing components on the vertically oriented motherboard of at least one other of the vertically oriented rack-mountable servers, wherein the vertically oriented rack-mountable servers are mountable in the at least one tank such that, when the vertically oriented rack-mountable servers are commonly at least partially submerged in the volume of dielectric liquid coolant in the at least one tank and the dielectric liquid coolant is moved within the at least one tank, at least one of the vertically oriented rack-mountable servers is independently vertically removable from the volume of dielectric liquid coolant in which the at least two vertically oriented rack-mountable servers are commonly at least partially submerged and from the at least one tank through the top of the tank while at least two of the other vertically oriented rack-mountable servers in the at least one row remain commonly at least partially submerged in the volume of dielectric liquid coolant in the at least one tank and the dielectric liquid coolant in the at least one tank continues to flow across heat producing electronic components of the at least two other rack-mountable servers remaining at least partially commonly submerged in the at least one row, wherein each of at least two of the fluid velocity augmentation devices is configured to increase upward fluid velocity of flow of dielectric liquid coolant through the vertically oriented rack-mountable servers or upwardly between adjacent ones of the vertically oriented rack-mountable servers, wherein the volume of dielectric liquid coolant comprises at least one passage in the tank that is outside of the vertically oriented rack-mountable servers, wherein, when the at least one pump is operated to move the dielectric liquid coolant vertically across the heat producing components on the vertically oriented motherboards, a circuit is formed in which a first portion of dielectric liquid coolant is moved vertically upward across the heat producing components on the vertically oriented motherboards and then downward outside of the rack mountable servers in the at least one passage, while a second portion of the dielectric liquid coolant flows out of the tank, wherein the secondary cooling apparatus is configured to reject, by way of the remote heat exchanger, heat transferred from the second portion of the dielectric liquid coolant.

23. The apparatus of claim 22, wherein, when the plurality of rack-mountable servers are mountably received, at least one of the vertically oriented rack-mountable servers is completely submerged within the dielectric liquid coolant such that a volume of dielectric liquid coolant collects in a common manifold area above the at least one vertically oriented rack-mountable server to improve the circulation of the liquid coolant through the vertically oriented rack-mountable servers, thereby enhancing the cooling of the vertically oriented rack-mountable server.

24. The apparatus of claim 22, wherein the at least one tank comprises an open or openable top, wherein the vertically oriented rack-mountable servers are mountable such that at least one of the vertically oriented rack-mountable servers can be removed from the tank through the open or openable top while at least two of the other vertically oriented rack-mountable servers remain commonly at least partially submersed in the dielectric liquid coolant and dielectric liquid coolant continues to flow across the at least two other vertically oriented rack-mountable servers.

25. An apparatus for cooling a plurality of rack-mountable servers containing heat generating electronic components in a server room, the cooling apparatus comprising:

at least one tank defining an open interior volume and having a coolant inlet for receiving a dielectric liquid coolant within the open interior volume and having a coolant outlet for allowing the dielectric liquid coolant to flow from the open interior volume, the coolant inlet and the coolant outlet being fluidly coupled to each other, wherein the at least one tank comprises an open or openable top sized to receive at least one row comprising a plurality of rack-mountable servers, each of at least two of the plurality of rack-mountable servers in the at least one row comprising a motherboard and heat producing components mounted to the motherboard;

one or more mounting members positioned within the interior volume and configured to mountably receive the plurality of rack-mountable servers within the interior volume, wherein the mounting members are configured to hold each of at least two of the rack-mountable servers in the at least one row in a horizontally stacked relationship with one another, with the rack-mountable servers in a vertical orientation such that one of the two smallest sides of the rack-mountable server faces upward and the motherboard of the rack-mountable server is vertically oriented, wherein at least two of the vertically oriented rack-mountable servers are independently operable from one another, wherein each of at least two of the vertically oriented rack-mountable servers is configured to connect to a computer network, a volume of dielectric coolant at least partially held in the at least one tank; and a multi-circuit fluid cooling apparatus, wherein, when the vertically oriented rack-mountable servers are mountably received in at least one row in the at least one tank, at least a portion of at least two of the vertically oriented rack-mountable servers being mountably received is held in the at least one tank such that at least two of the vertically oriented rack-mountable servers can be commonly at least partially submerged in a volume of the dielectric liquid coolant in the at least one tank for cooling the vertically oriented rack-mountable servers, wherein, when the vertically oriented rack-mountable servers are mountably received in the at least one tank and commonly at least partially submerged in the volume of dielectric liquid coolant in the at least one tank, the plurality of vertically oriented rack-mountable servers are thermally coupled to a remote heat exchanger outside of the server room via the multi-circuit fluid cooling apparatus, wherein the multiple-circuit fluid cooling apparatus comprises:

a dielectric liquid cooling apparatus;

a secondary cooling apparatus comprising a remote heat exchanger; and a liquid-to-liquid or liquid-to-refrigerant heat exchanger;

wherein the dielectric liquid cooling apparatus including one or more pumps, and a plurality of fluid velocity augmentation devices in the volume of dielectric liquid coolant in the at least one tank, wherein at least one of the pumps, the coolant inlet, the coolant outlet, and the mounting members are configured such that the at least one pump moves at least a portion of the dielectric liquid coolant in the volume of dielectric liquid coolant vertically across heat producing components on the vertically oriented motherboard of one of the vertically oriented rack-mountable servers in parallel flow with dielectric liquid coolant moved vertically across heat producing components on the vertically oriented motherboard of at least one other of the vertically oriented rack-mountable servers, wherein the vertically oriented rack-mountable servers are mountable in the at least one tank such that, when the vertically oriented rack-mountable servers are commonly at least partially submerged in the volume of dielectric liquid coolant in the at least one tank and the dielectric liquid coolant is moved within the at least one tank, at least one of the vertically oriented rack-mountable servers is independently vertically removable from the volume of dielectric liquid coolant in which the at least two vertically oriented rack-mountable servers are commonly at least partially submerged and from the at least one tank through the top of the tank while at least two of the other vertically oriented rack-mountable servers in the at least one row remain commonly at least partially submerged in the volume of dielectric liquid coolant in the at least one tank and the dielectric liquid coolant in the at least one tank continues to flow across heat producing electronic components of the at least two other vertically oriented rack-mountable servers remaining at least partially commonly submerged in the at least one row, wherein the one or more mounting members are configured to mountably receive the plurality of vertically oriented rack-mountable servers above the bottom of the at least one tank to form a volume between the plurality of vertically oriented rack-mountable servers and the bottom of the at least one tank in which the dielectric liquid coolant can collect to permit the flow of dielectric liquid coolant through the plurality of vertically oriented rack-mountable servers, wherein the volume of dielectric liquid coolant comprises at least one passage in the tank that is outside of the vertically oriented rack-mountable servers, wherein, when the at least one pump is operated to move the dielectric liquid coolant vertically across the heat producing components on the vertically oriented motherboards, a circuit is formed in which a first portion of dielectric liquid coolant is moved vertically upward across the heat producing components on the vertically oriented motherboards and then downward outside of the rack mountable servers in the at least one passage, while a second portion of the dielectric liquid coolant flows out of the tank and through the liquid-to-liquid or liquid-to-refrigerant heat exchanger, wherein the liquid-to-liquid or liquid-to-refrigerant heat exchanger is configured to transfer heat from the second portion of dielectric liquid coolant in the circuit to liquid or refrigerant moving in the secondary cooling apparatus, wherein the secondary cooling apparatus is configured to reject, by way of the remote heat exchanger, at least part of the heat transferred from the second portion of the dielectric liquid coolant wherein, when the plurality of rack-mountable servers are mountably received, the plurality of rack-mountable servers are completely submerged within the dielectric liquid coolant such that a volume of dielectric liquid coolant collects in a common manifold area above the plurality of rack-mountable servers, wherein one part of the heated dielectric liquid coolant that has collected in the common manifold area recirculates downward in at least one passage to the bottom of the at least one tank, and wherein another part of the heat heated dielectric coolant that has collected in the common manifold area exits the at least one tank through the coolant outlet in the second portion of dielectric liquid coolant.

26. The apparatus of claim 25, wherein the dielectric liquid coolant flows from the volume between the plurality of vertically oriented rack-mountable servers and the at least one tank to the common manifold area above the plurality of vertically oriented rack-mountable servers.

27. The apparatus of claim 1, further comprising:
a controller separate from the vertically oriented rack-mountable servers for controlling the cooling apparatus, wherein said controller provides instructions for periodically monitoring the temperature of the liquid coolant at at least one location within the first fluid circuit; and in response to the periodic determination of the temperature, adjusting the amount of heat to be rejected through the remote heat exchanger such that the dielectric liquid coolant is maintained at an elevated temperature in at least a portion of the first fluid circuit between the exits of the vertically oriented rack-mountable servers and the coolant outlet.

28. The apparatus of claim 27, wherein the controller provides further instructions for periodically:
determining the optimum elevated temperature of the heated dielectric liquid coolant as it exits the plurality of vertically oriented rack-mountable servers in order for the dielectric liquid coolant to sufficiently cool the vertically oriented rack-mountable servers while reducing the amount of energy consumed to sufficiently cool each vertically oriented respective server;

determining the amount of energy needed to reject the absorbed heat for cooling the vertically oriented rack-mountable servers; and in response to the periodic determinations of the optimum elevated temperature and the amount of energy needed to reject the absorbed heat, adjusting the amount of heat to be rejected through the remote heat exchanger in order that the dielectric liquid coolant is maintained at approximately the optimum elevated temperature in the at least a portion of the circuit between the exits of the vertically oriented rack-mountable servers and the coolant outlet.

29. The apparatus of claim 27, wherein the elevated temperature is a temperature in the range of 90 degrees F. and 130 degrees F.

30. The apparatus of claim 27, wherein the elevated temperature is a temperature in the range of 100 degrees F. and 110 degrees F.

31. The apparatus of claim 1,
wherein the circuit includes heated dielectric coolant that has exited the vertically oriented rack-mountable servers at the top of the at least one row of vertically oriented rack-mountable servers, wherein one part of the heated dielectric liquid coolant that has exited the vertically oriented rack-mountable servers at the top of the at least one row of vertically oriented rack-mountable servers recirculates downward in the at least one passage to the bottom of the at least one tank, wherein another part of the heated dielectric liquid coolant that has exited the vertically oriented rack-mountable servers at the top of the at least one row of vertically oriented rack-mountable servers exits the at least one tank in the second portion of dielectric liquid coolant.

32. The apparatus of claim 1,
wherein heated dielectric liquid coolant exiting the rack-mountable servers collects in a common manifold area above the top of the vertically oriented rack-mountable servers in the at least one row, wherein one part of the heated dielectric liquid coolant that has collected in the common manifold area recirculates downward in at least one passage to the bottom of the at least one tank, and wherein another part of the heat heated dielectric coolant that has collected in the common manifold area exits the at least one tank in the second portion of dielectric liquid coolant.

33. The apparatus of claim 1,
wherein the cooling outlet is proximate to surface of the volume of dielectric liquid coolant in the at least one tank, and wherein at least a portion of the second portion of dielectric liquid coolant exiting the at least one tank is drawn from heated dielectric liquid coolant proximate to the surface of the volume of dielectric liquid coolant.

\* \* \* \* \*